(12) United States Patent
Ohnishi et al.

(10) Patent No.: US 11,670,674 B2
(45) Date of Patent: **\*Jun. 6, 2023**

(54) SEMICONDUCTOR DEVICE

(71) Applicant: ROHM CO., LTD., Kyoto (JP)

(72) Inventors: Shimpei Ohnishi, Kyoto (JP); Masaki Nagata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 29 days.

This patent is subject to a terminal disclaimer.

(21) Appl. No.: 17/363,868

(22) Filed: Jun. 30, 2021

(65) Prior Publication Data

US 2021/0328008 A1 Oct. 21, 2021

Related U.S. Application Data

(63) Continuation of application No. 16/782,844, filed on Feb. 5, 2020, now Pat. No. 11,081,545.

(30) Foreign Application Priority Data

Feb. 19, 2019 (JP) .............................. JP2019-027587

(51) Int. Cl.
*H01L 29/06* (2006.01)
*H01L 29/40* (2006.01)
(Continued)

(52) U.S. Cl.
CPC ...... *H01L 29/0634* (2013.01); *H01L 21/2253* (2013.01); *H01L 21/26513* (2013.01);
(Continued)

(58) Field of Classification Search
None
See application file for complete search history.

(56) References Cited

U.S. PATENT DOCUMENTS 11,081,545 B2 * 8/2021 Ohnishi .............. H01L 29/7811
2007/0052014 A1 3/2007 Takahashi

FOREIGN PATENT DOCUMENTS

JP 2009187994 A 8/2009
JP 2011512677 A 4/2011
(Continued)

OTHER PUBLICATIONS

Notice of Reasons for Refusal issued for Japanese Patent Application No. 2019-027587, dated Jan. 12, 2023, 11 pages including English machine translation.

*Primary Examiner* — Robert K Carpenter
(74) *Attorney, Agent, or Firm* — Hamre, Schumann, Mueller & Larson, P.C.

(57) ABSTRACT

A semiconductor device includes a first conductivity type semiconductor layer having a first surface and a second surface opposite to the first surface and having an element portion formed in the first surface and an outer peripheral portion surrounding the element portion, a semiconductor element structure formed in the element portion, multiple guard ring trenches formed in the outer peripheral portion and each formed in the first surface of the semiconductor layer, and a second conductivity type outer peripheral portion impurity region formed in the outer peripheral portion, in which the multiple guard ring trenches include a first unit consisting of multiple guard ring trenches and a second unit consisting of multiple guard ring trenches arranged on the outside of the semiconductor layer relative to the multiple guard ring trenches belonging to the first unit, and in which the outer peripheral portion impurity region includes a first portion arranged below the multiple guard ring trenches belonging to the first unit and having a first depth with respect to the first surface of the semiconductor layer and a second portion arranged below the multiple guard ring trenches belonging to the second unit and having a second (Continued)

depth smaller than the first depth with respect to the first surface of the semiconductor layer.

18 Claims, 27 Drawing Sheets

(51) Int. Cl.
*H01L 29/78* (2006.01)
*H01L 29/66* (2006.01)
*H01L 21/265* (2006.01)
*H01L 21/225* (2006.01)

(52) U.S. Cl.
CPC .......... *H01L 29/401* (2013.01); *H01L 29/404* (2013.01); *H01L 29/407* (2013.01); *H01L 29/66734* (2013.01); *H01L 29/7811* (2013.01); *H01L 29/7813* (2013.01)

(56) References Cited

FOREIGN PATENT DOCUMENTS

| | | | |
|---|---|---|---|
| JP | 2013033931 | A | 2/2013 |
| JP | 2015126086 | A | 7/2015 |
| JP | 2016189368 | A | 11/2016 |
| JP | 2018148000 | | 9/2018 |

* cited by examiner

SEMICONDUCTOR DEVICE

CROSS-REFERENCE TO RELATED APPLICATIONS

This application corresponds to Japanese Patent Application No. 2019-027587 filed on Feb. 19, 2019 in the Japan Patent Office, the disclosure of which is incorporated herein by reference in its entirety.

TECHNICAL FIELD

The present invention relates to a semiconductor device having a guard ring.

BACKGROUND ART

There has been known multiple guard rings provided in an outer peripheral region of a semiconductor substrate as a termination withstand voltage structure of a semiconductor device.

For example, in a semiconductor device described in Patent Literature 1 (Japanese Patent Application Publication No. 2018-148000), an element portion with a functional structure provided therein and a peripheral portion with a termination withstand voltage structure provided therein are sectionally defined. The termination withstand voltage structure is provided on a surface of the semiconductor substrate and has multiple embedded insulating films arranged with spacing therebetween in a direction away from the element portion, a first conductivity type drift region provided in the semiconductor substrate, multiple second conductivity type guard ring regions provided in a superficial portion of the semiconductor substrate and each arranged between adjacent ones of the embedded insulating films, and a second conductivity type RESURF region provided in a superficial portion of the semiconductor substrate and extending from a surficial region in a direction away from the element portion.

SUMMARY OF INVENTION

It is hence an object of the present invention to provide a semiconductor device in which electric field concentration in an outer peripheral portion can be reduced.

A semiconductor device according to a preferred embodiment of the present invention includes a first conductivity type semiconductor layer having a first surface and a second surface opposite to the first surface and having an element portion formed in the first surface and an outer peripheral portion surrounding the element portion, a semiconductor element structure formed in the element portion, multiple guard ring trenches formed in the outer peripheral portion and each formed in the first surface of the semiconductor layer, and a second conductivity type outer peripheral portion impurity region formed in the outer peripheral portion, in which the multiple guard ring trenches include a first unit consisting of multiple guard ring trenches and a second unit consisting of multiple guard ring trenches arranged on the outside of the semiconductor layer relative to the multiple guard ring trenches belonging to the first unit, and in which the outer peripheral portion impurity region includes a first portion arranged below the multiple guard ring trenches belonging to the first unit and having a first depth with respect to the first surface of the semiconductor layer and a second portion arranged below the multiple guard ring trenches belonging to the second unit and having a second depth smaller than the first depth with respect to the first surface of the semiconductor layer.

DESCRIPTION OF EMBODIMENTS

Preferred embodiments of the present invention will hereinafter be described in detail with reference to the accompanying drawings.

Figure 1:
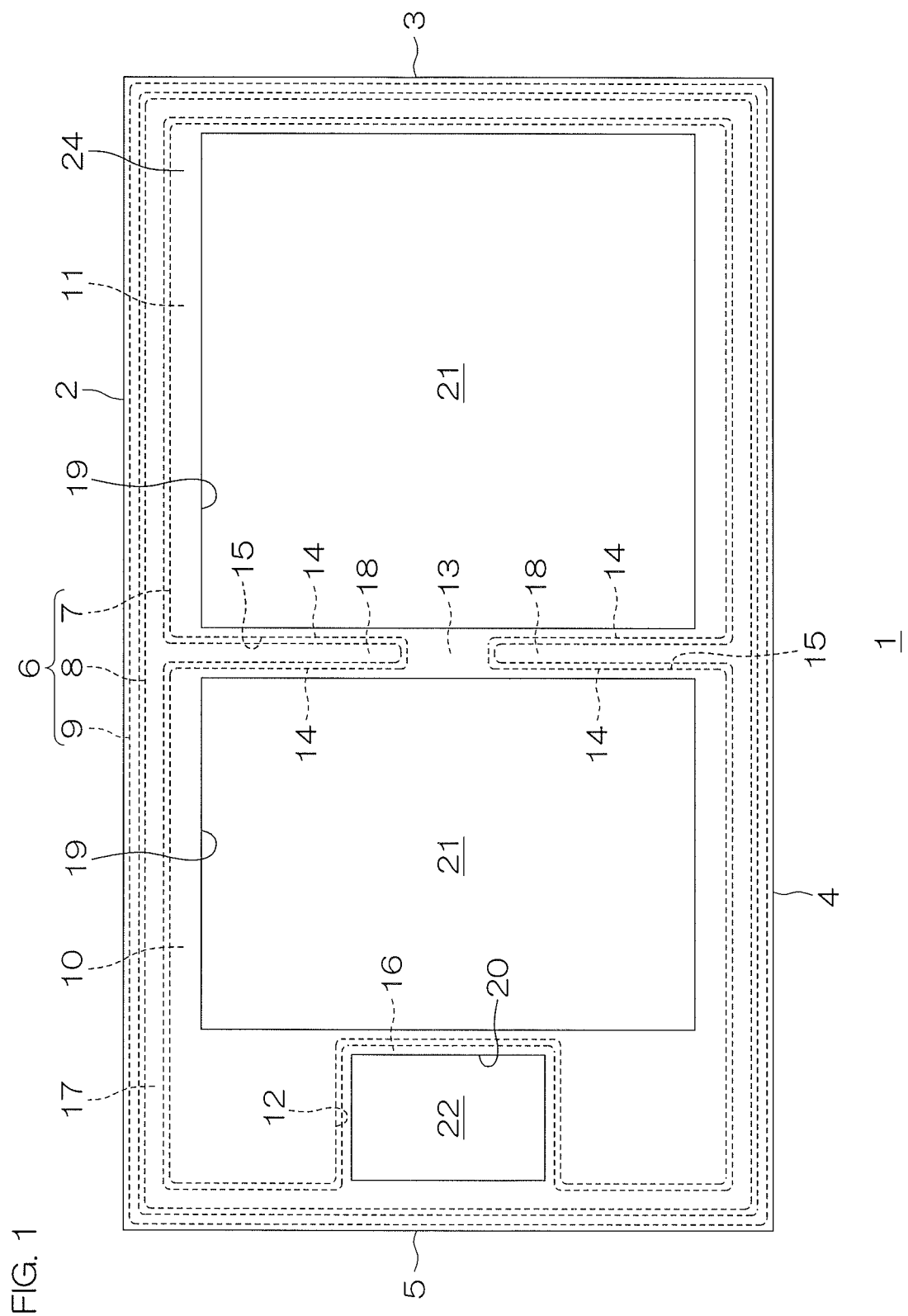
FIG. 1 is a plan view of a semiconductor device according to a preferred embodiment of the present invention.
Figure 2:
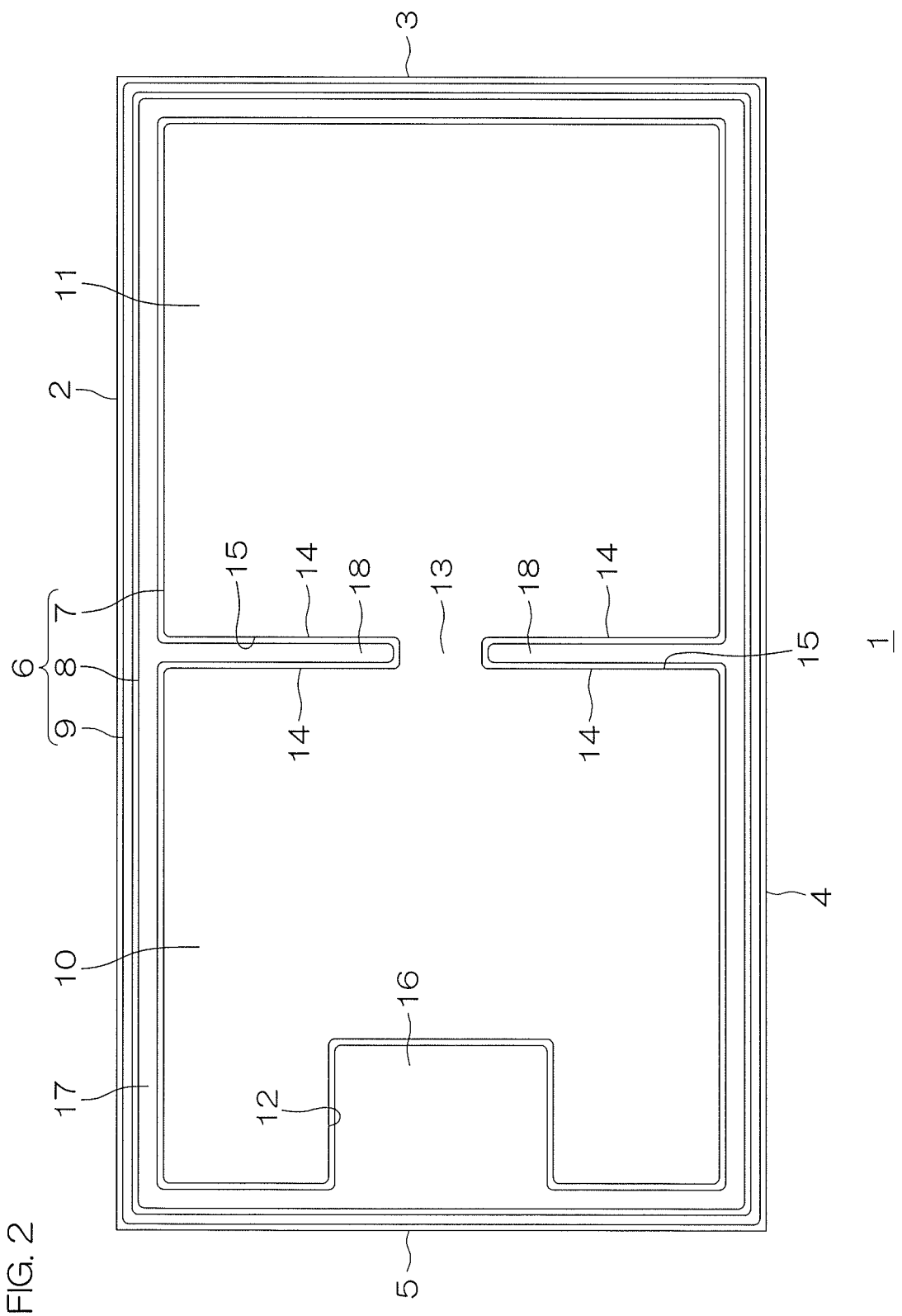
FIG. 2 is a plan view of a semiconductor device (with some elements made transparent) according to a preferred embodiment of the present invention.
Figure 3:
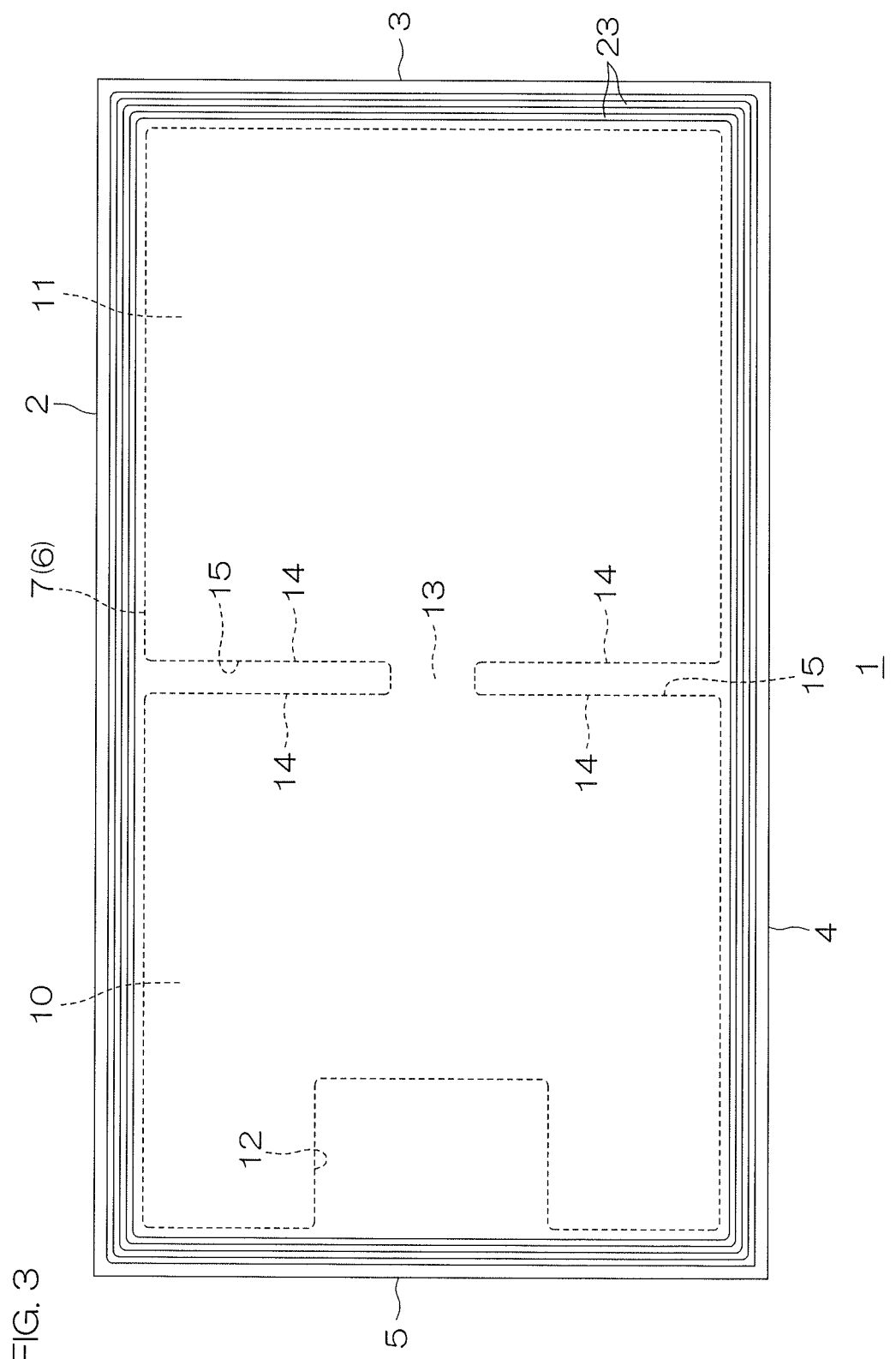
FIG. 3 is a plan view of a semiconductor device (with some elements made transparent) according to a preferred embodiment of the present invention.

FIGS. 1 to 3 are plan views of a semiconductor device 1 according to a preferred embodiment of the present invention. In FIGS. 2 and 3, some elements of the semiconductor device 1 shown in FIG. 1 are made transparent for convenience in understanding. More specifically, FIG. 2 is a plan view of the semiconductor device 1 without a passivation film 24 in FIG. 1. FIG. 3 is a plan view of the semiconductor device 1 without a surface electrode film 6 in FIG. 2. It is noted that in FIG. 3, the shape of a source electrode film 7 of the surface electrode film 6 is indicated by a broken line.

The semiconductor device 1 has, for example, a rectangular parallelepiped shape. In this preferred embodiment, the semiconductor device 1 has a rectangular shape in a plan view. The semiconductor device 1 has, for example, a first end face 2, a second end face 3, a third end face 4, and a fourth end face 5 in this order clockwise on the drawing sheet.

As shown in FIGS. 1 and 2, a surface electrode film 6 is formed selectively on the surface of the semiconductor device 1. The surface electrode film 6 is composed of AlCu (an alloy of aluminum and copper) in this preferred embodiment, but may be composed of another conducting material (e.g. aluminum).

The surface electrode film 6 includes a source electrode film 7, a gate electrode film 8, and an outer peripheral electrode film 9. The source electrode film 7 covers most of the surface of the semiconductor device 1. The gate electrode film 8 is separated from and surrounds the source electrode film 7. The outer peripheral electrode film 9 is separated from and surrounds the gate electrode film 8.

More specifically, the source electrode film 7 includes a first portion 10 and a second portion 11 adjacent to each other in a direction along at least one of the end faces of the semiconductor device 1 (in this preferred embodiment, the longitudinal direction of the semiconductor device 1, that is, the direction along the first end face 2 and the third end face 4). The first portion 10 of the source electrode film 7 is formed in an approximately quadrilateral shape in a plan view having a recessed portion 12 in a portion facing one of the end faces of the semiconductor device 1 (in this preferred embodiment, the fourth end face 5).

The recessed portion 12 is formed in an approximately quadrilateral shape in a plan view and has an opening end opened facing one of the end faces of the semiconductor device 1 (in this preferred embodiment, the fourth end face 5). On the other hand, the second portion 11 of the source electrode film 7 is formed in a quadrilateral shape in a plan view.

The first portion 10 and the second portion 11 of the source electrode film 7 are connected to each other through a connection 13. The connection 13 of the source electrode film 7 connects, for example, parts of the respective mutually opposed edge portions 14 of the first portion 10 and the second portion 11. As such, the remaining portions of the edge portions 14 of the first portion 10 and the second portion 11 are opposed to each other with spacing therebetween to form slits 15 adjacent to the connection 13. In this preferred embodiment, the connection 13 of the source electrode film 7 is formed in an intermediate portion of the edge portions 14 of the first portion 10 and the second portion 11, and a pair of slits 15 are formed on either side of the connection 13.

The gate electrode film 8 includes a pad portion 16 and a gate finger 17. The pad portion 16 of the gate electrode film 8 is formed in an approximately quadrilateral shape in a plan view and arranged in the recessed portion 12 in the first portion 10 of the source electrode film 7. The gate finger 17 is connected integrally to the pad portion 16. The gate finger 17 extends from the pad portion 16 annularly around the source electrode film 7. The gate finger 17 also has branch portions 18 that extend from around the source electrode film 7 into the slits 15. As such, the first portion 10 and the second portion 11 of the source electrode film 7 are respectively surrounded almost circumferentially by the gate finger 17 except the connection 13.

The outer peripheral electrode film 9 annularly surrounds the gate electrode film 8. In this preferred embodiment, the outer peripheral electrode film 9 has a closed annular shape with a constant width. The width of the outer peripheral electrode film 9 may be smaller than the width of the gate electrode film 8. Also, the outer peripheral electrode film 9 is separated inward from the first end face 2, the second end face 3, the third end face 4, and the fourth end face 5 of the semiconductor device 1.

A passivation film 24 is formed on the surface of the semiconductor device 1 to cover the surface electrode film 6. As shown in FIG. 1, the passivation film 24 is formed with pad openings 19 through which the first portion 10 and the second portion 11 of the source electrode film 7 are partially exposed and a pad opening 20 through which the pad portion 16 of the gate electrode film 8 is partially exposed.

The portions of the source electrode film 7 exposed through the pad openings 19 are called source pad 21, while the portion of the gate electrode film 8 exposed through the pad opening 20 is called gate pad 22. In this preferred embodiment, the pad openings 19, 20 are each formed in a quadrilateral shape in a plan view. On the other hand, the remaining portion of the source electrode film 7 other than the source pad 21, the remaining portion of the gate electrode film 8 other than the gate pad 22, and the entire outer peripheral electrode film 9 are covered with the passivation film 24.

As shown in FIG. 3, the semiconductor device 1 is formed with multiple guard ring trenches 23 that surround the source electrode film 7 in a plan view. The guard ring trenches 23 are formed in a closed annular shape along the first end face 2, the second end face 3, the third end face 4, and the fourth end face 5 of the semiconductor device 1. It is noted that a specific configuration of the multiple guard ring trenches 23 will hereinafter be described in detail.

Figure 4:
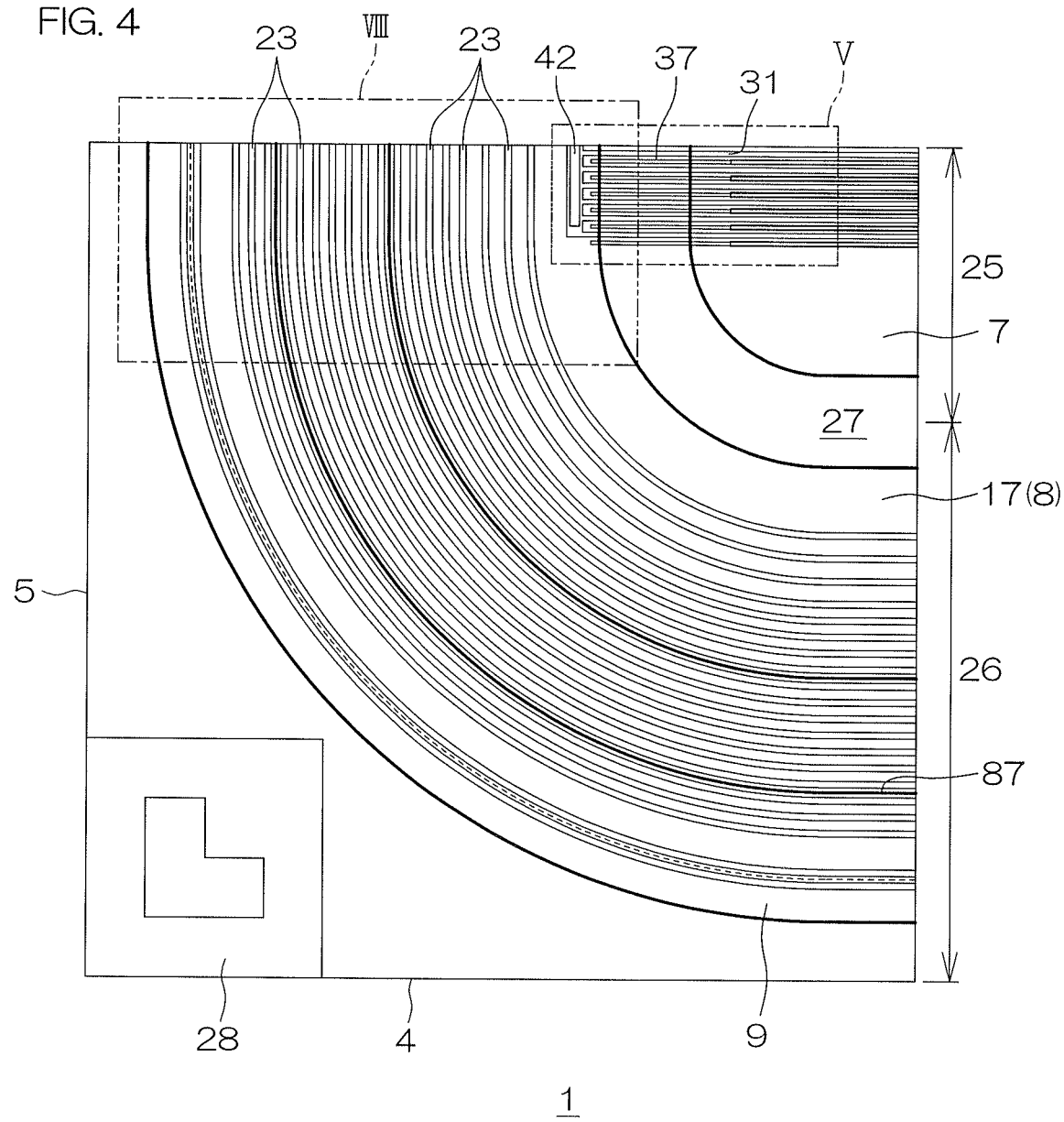
FIG. 4 is a substantial part enlarged view of a semiconductor device according to a preferred embodiment of the present invention.
Figure 5:
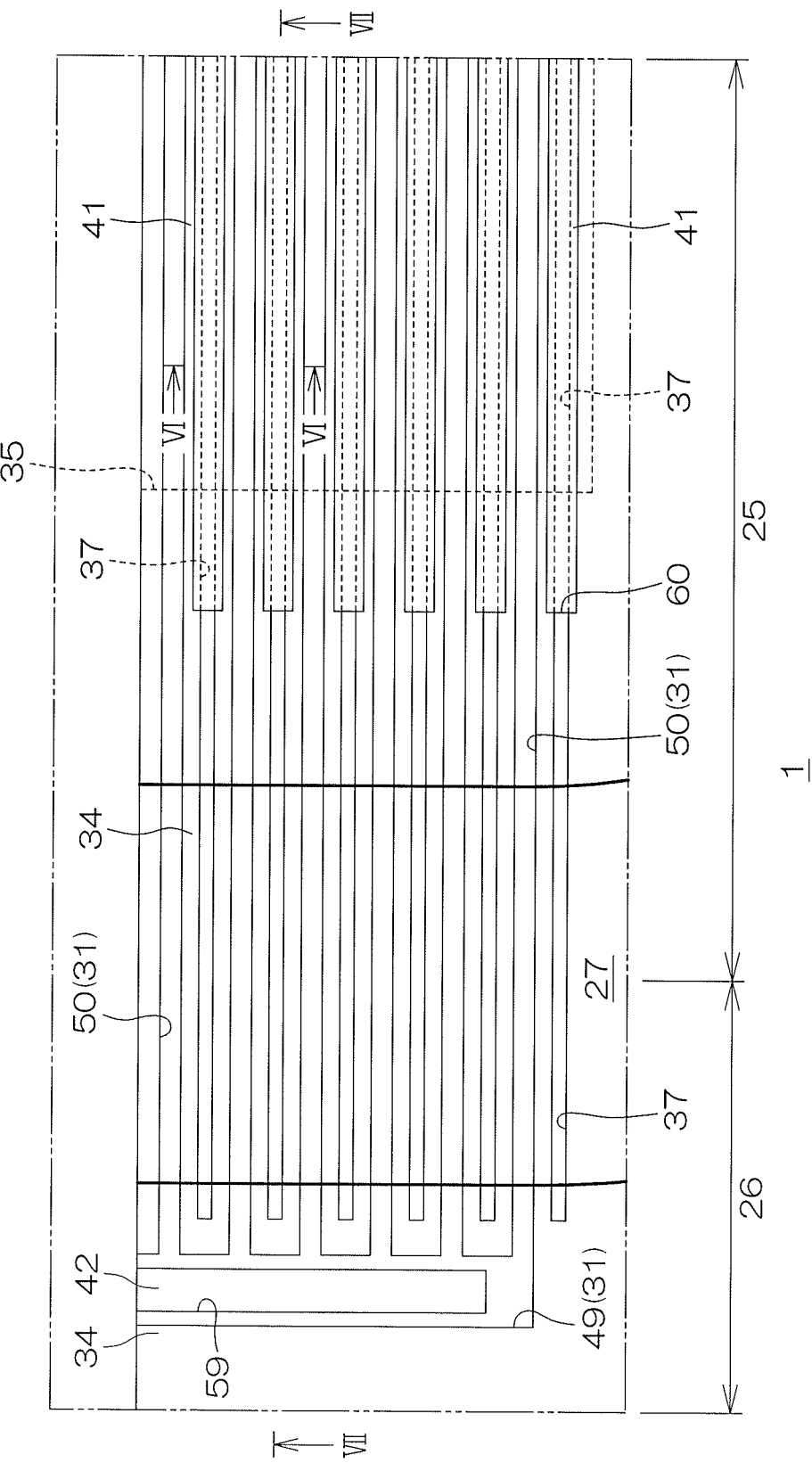
FIG. 5 is an enlarged view of a portion enclosed by an alternate long and two short dashed line V in FIG. 4.
Figure 6:
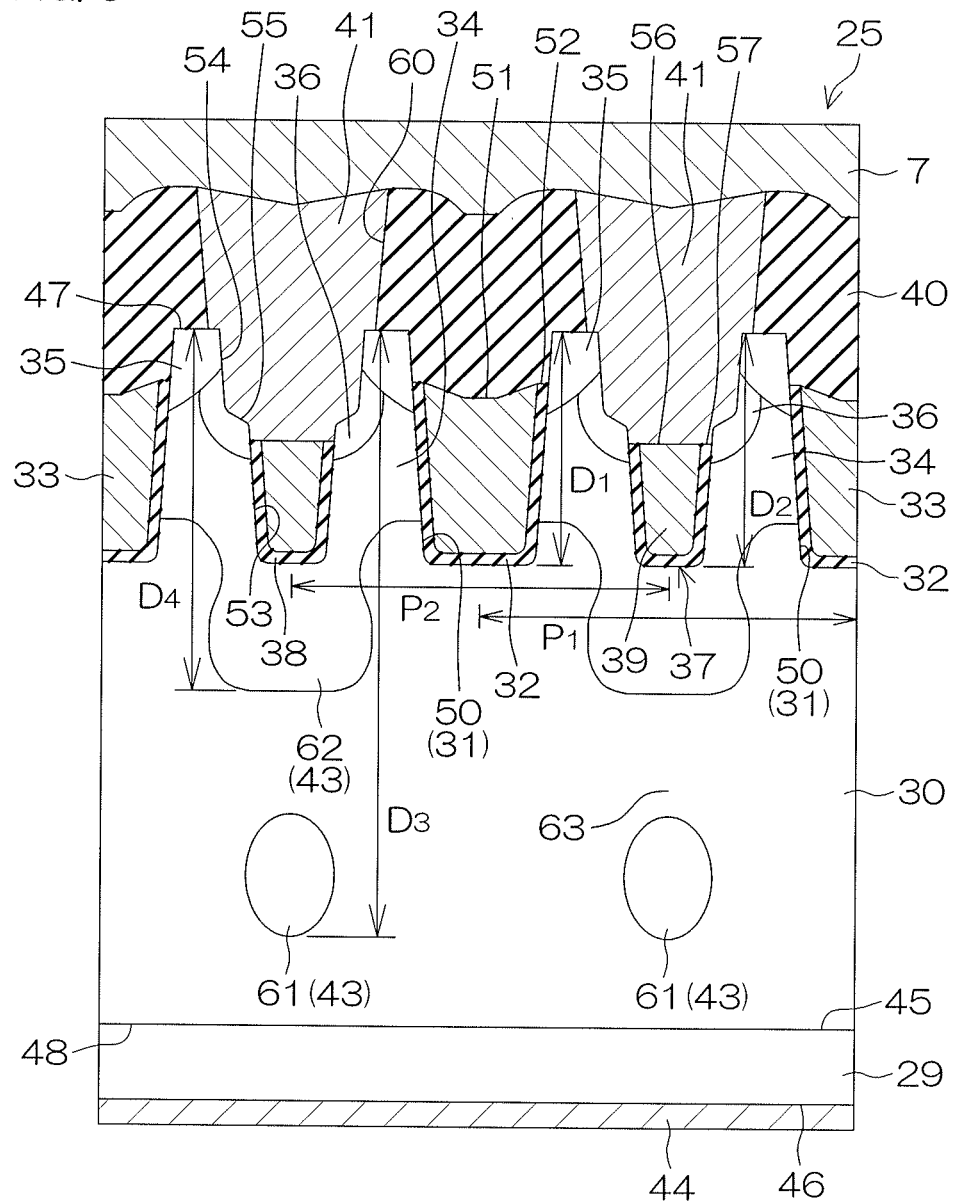
FIG. 6 is a cross-sectional view of the VI-VI cross-section in FIG. 5.
Figure 7:
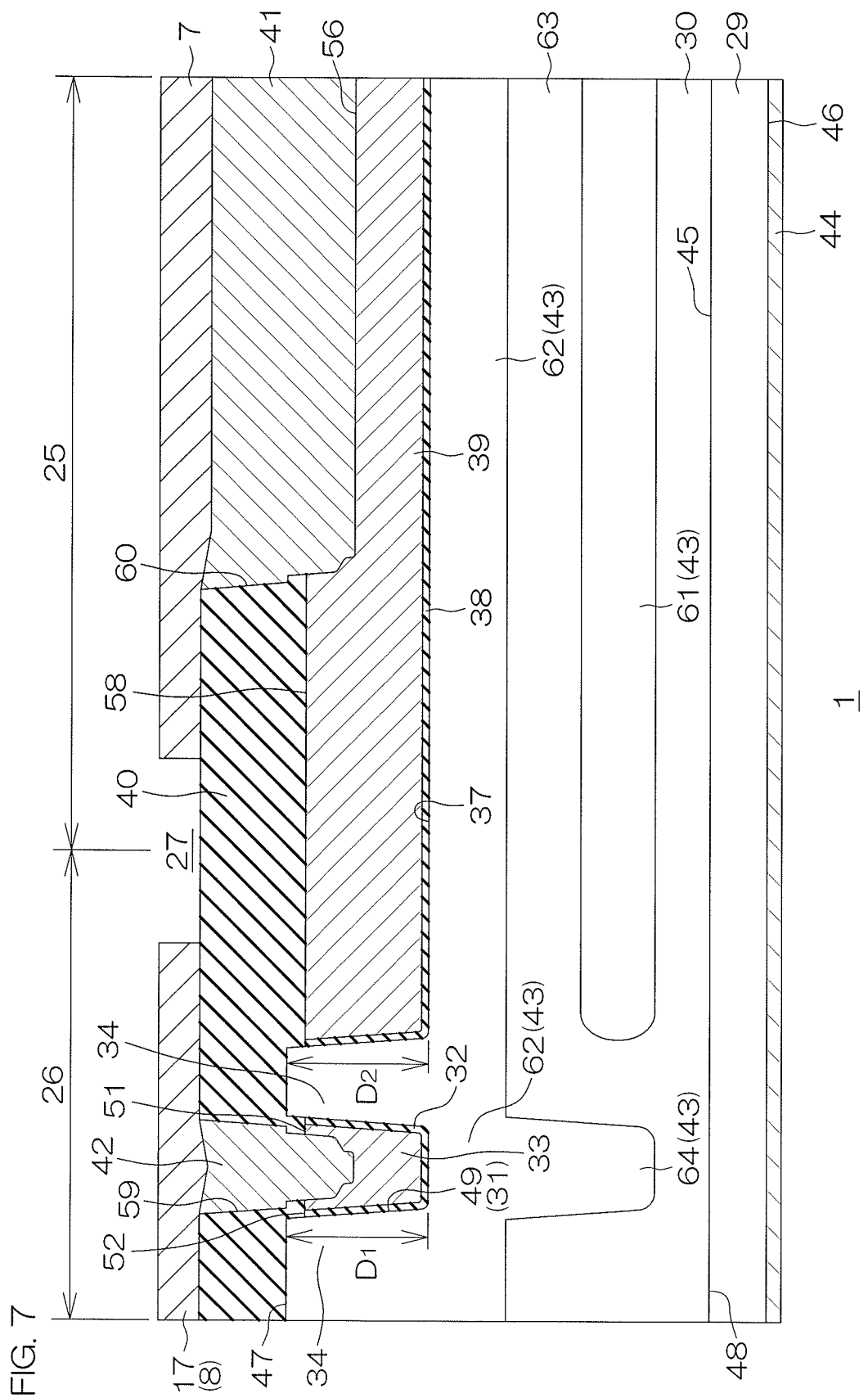
FIG. 7 is a cross-sectional view of the VII-VII cross-section in FIG. 5.
Figure 8:
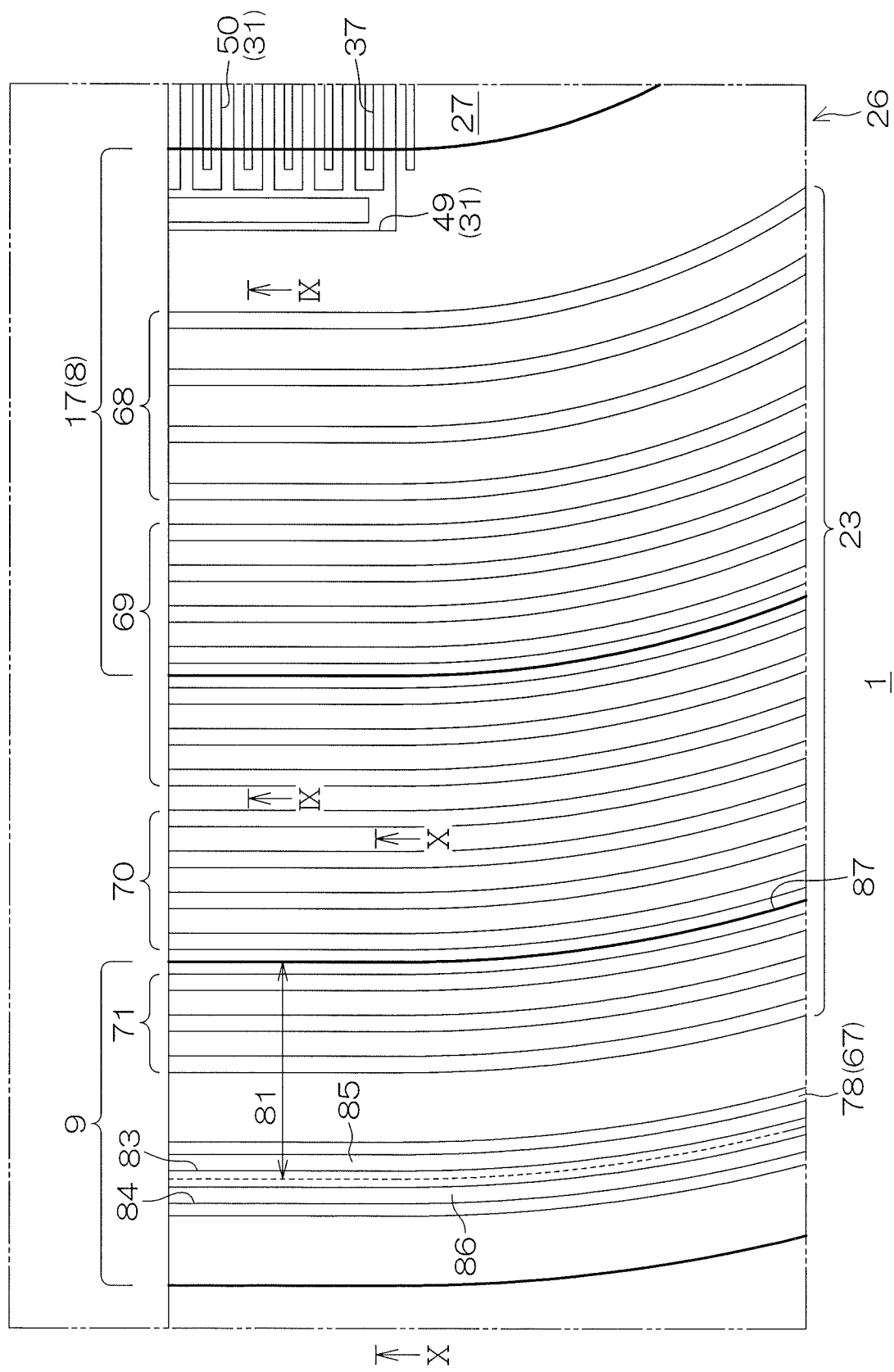
FIG. 8 is an enlarged view of a portion enclosed by an alternate long and two short dashed line VIII in FIG. 4.
Figure 9:
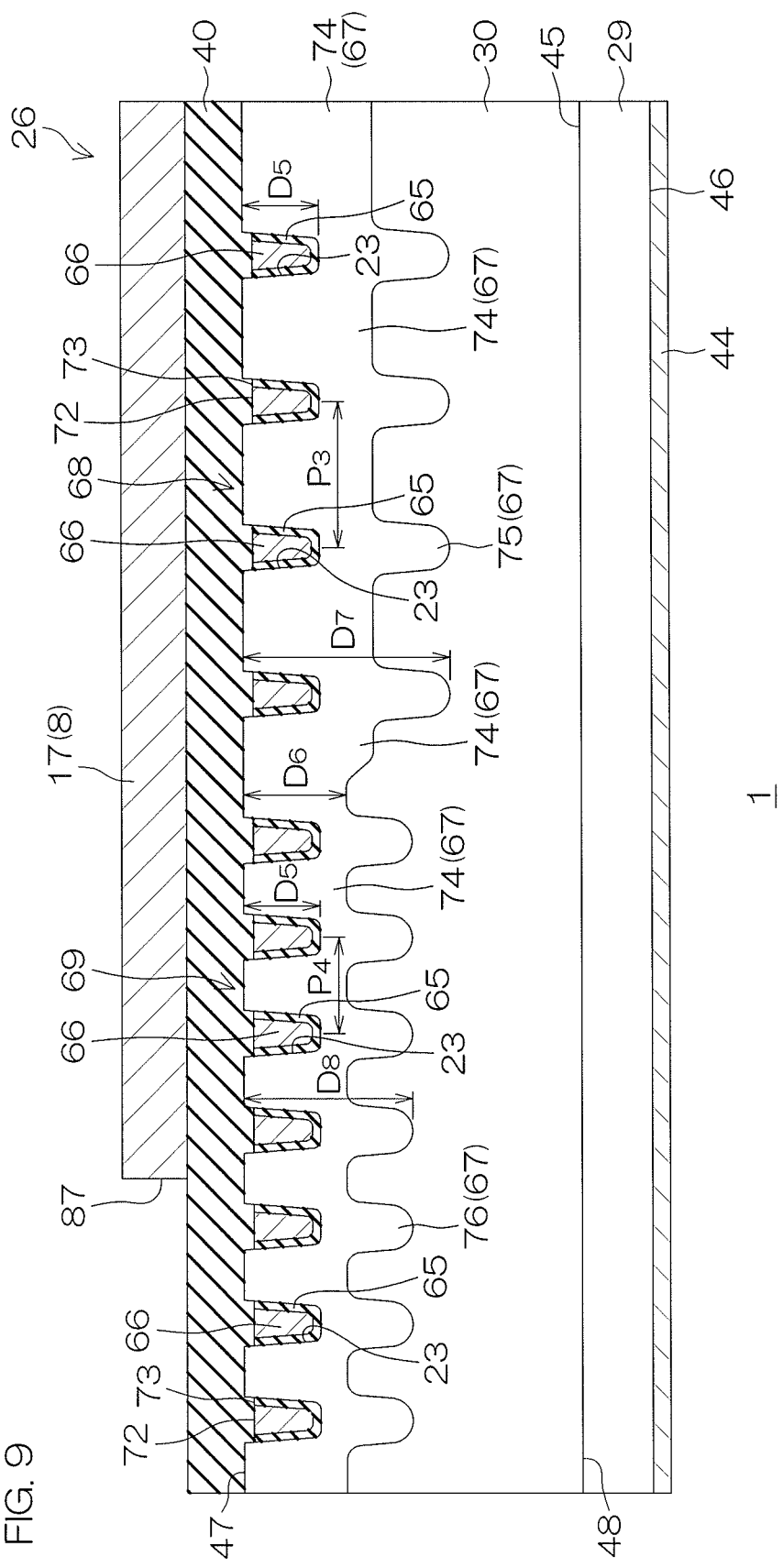
FIG. 9 is a cross-sectional view of the IX-IX cross-section in FIG. 8.
Figure 10:
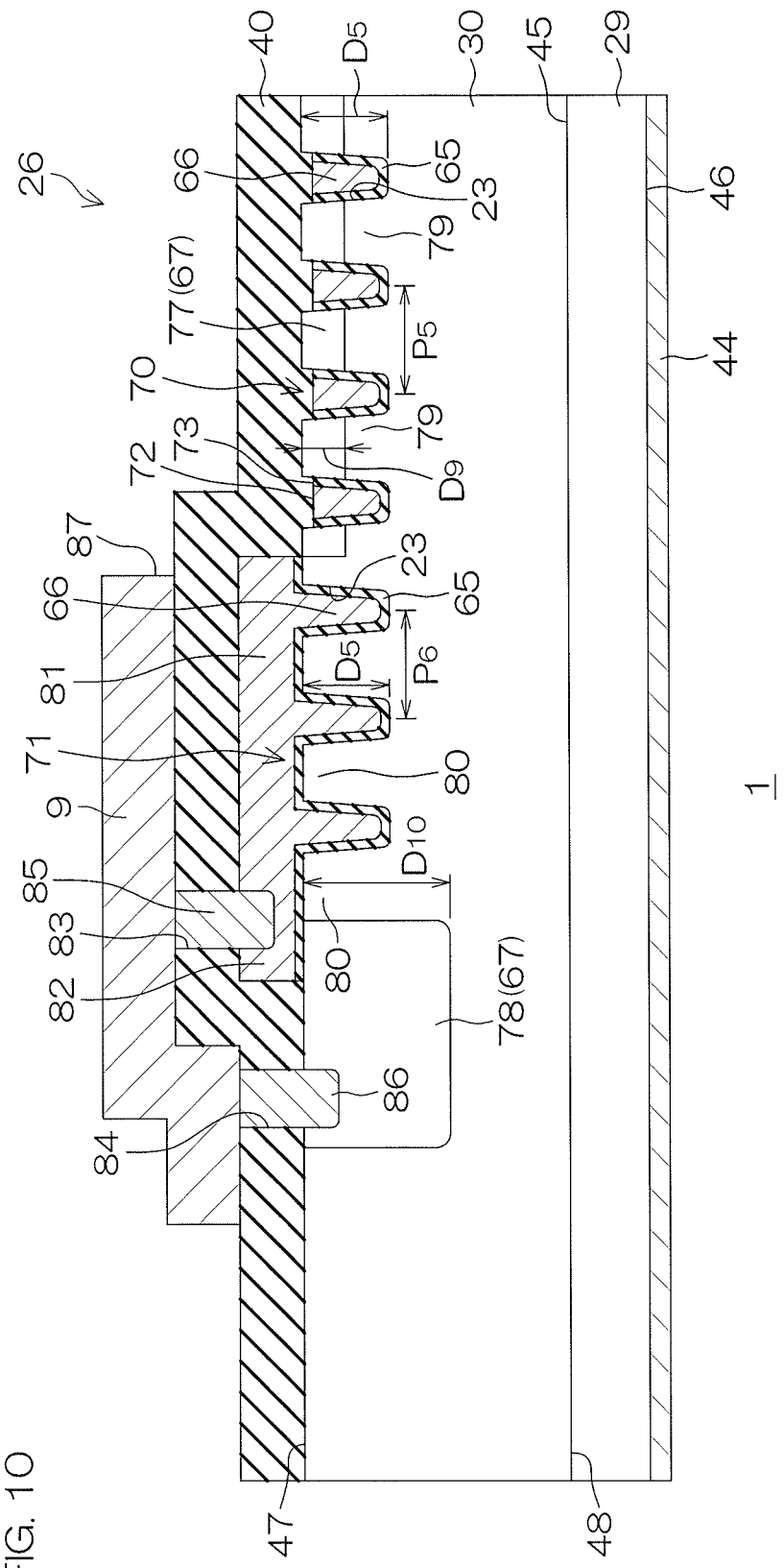
FIG. 10 is a cross-sectional view of the X-X cross-section in FIG. 8.

FIG. 4 is a substantial part enlarged view of the semiconductor device 1 according to a preferred embodiment of the present invention. FIG. 5 is an enlarged view of a portion enclosed by an alternate long and two short dashed line V in FIG. 4. FIG. 6 is a cross-sectional view of the VI-VI cross-section in FIG. 5. FIG. 7 is a cross-sectional view of the VII-VII cross-section in FIG. 5. FIG. 8 is an enlarged view of a portion enclosed by an alternate long and two short dashed line VIII in FIG. 4. FIG. 9 is a cross-sectional view of the IX-IX cross-section in FIG. 8. FIG. 10 is a cross-sectional view of the X-X cross-section in FIG. 8.

Next will be described specific structures of an element portion 25 and an outer peripheral portion 26 of the semiconductor device 1. The structure of the element portion 25 will be described with reference to FIGS. 4 to 7, and thereafter the structure of the outer peripheral portion 26 will be described with reference to FIGS. 8 to 10.

First, the element portion 25 and the outer peripheral portion 26 of the semiconductor device 1 (semiconductor substrate 29 to be described hereinafter) may be defined as follows.

More specifically, the gate electrode film 8 is formed in a manner separated outward from the source electrode film 7, as mentioned above. Thus, as shown in FIG. 4, there is an annular region 27 with no electrode film therein between the source electrode film 7 and the gate electrode film 8, and the region 27 may serve as a boundary to define the inside of the region 27 as the element portion 25, while the outside of the region 27 as the outer peripheral portion 26. The element portion 25 is a region in which a semiconductor element structure (e.g. a MISFET structure to be described hereinafter) of the semiconductor device 1 is mainly arranged, but need not be entirely composed of a semiconductor element structure. That is, a structure other than the semiconductor element structure may be formed in a portion of the element portion 25, while a portion of the semiconductor element structure may be formed in a portion of the outer peripheral portion 26.

Also, in the outer peripheral portion 26, alignment marks 28 are formed at the corners of the semiconductor device 1.

<Structure of the Element Portion 25>

As shown in FIGS. 4 to 7, the semiconductor device 1 includes a semiconductor substrate 29 and an epitaxial layer 30. The semiconductor device 1 further includes, in the element portion 25, a gate trench 31, a gate insulating film 32, a gate electrode 33, a channel region 34, a source region 35, a channel contact region 36, a field trench 37, a field trench insulating film 38 as an example of the second insulating film of the present invention, a field plate 39, an interlayer insulating film 40, a source contact 41 as an example of the embedded contact of the present invention, a gate contact 42, an element portion impurity region 43, and a drain electrode 44.

The semiconductor substrate 29 has a principal surface 45 and a secondary surface 46 facing opposite to the principal surface 45 in the thickness direction of the semiconductor substrate 29. The principal surface 45 is a surface that is in contact with the epitaxial layer 30. The secondary surface 46 is entirely exposed out of the semiconductor device 1.

The semiconductor substrate 29 is composed of a silicon (Si) substrate in this preferred embodiment, but may be composed of another material (e.g. silicon carbide (SiC), gallium nitride (GaN)). The semiconductor substrate 29 is of an n type in this preferred embodiment. The semiconductor substrate 29 has an impurity concentration within a range of, for example, $1\times10^{19}$ cm$^{-3}$ to $1\times10^{20}$ cm$^{-3}$. The semiconductor substrate 29 also has a thickness within a range of, for example, 50 μm to 300 μm.

The epitaxial layer 30 is in contact with the semiconductor substrate 29 and layered on the semiconductor substrate 29. The epitaxial layer 30 has an element principal surface 47 and a bonding surface 48 facing opposite to the element principal surface 47 in the thickness direction of the epitaxial layer 30. The element principal surface 47 is a surface on which a MISFET structure is formed as an example of the semiconductor element structure of the present invention. The bonding surface 48 is a surface that is in contact with the principal surface 45 of the semiconductor substrate 29.

The epitaxial layer 30 is composed of silicon (Si) in this preferred embodiment, but may be composed of another material (e.g. silicon carbide (SiC), gallium nitride (GaN)).

The epitaxial layer 30 has the same conductivity type as the semiconductor substrate 29, which is an n type in this preferred embodiment. The epitaxial layer 30 has an impurity concentration lower than that of the semiconductor substrate 29, which is, for example, within a range of $1\times10^{15}$ cm$^{-3}$ to $1\times10^{17}$ cm$^{-3}$. Thus, in order to distinguish the conductivity type between the semiconductor substrate 29 and the epitaxial layer 30, the conductivity type of the semiconductor substrate 29 may be defined as an n$^+$ type, while the conductivity type of the epitaxial layer 30 may be defined as an n$^-$ type, for example. The epitaxial layer 30 also has a thickness within a range of, for example, 4.0 μm to 8.0 μm.

It is noted that the semiconductor substrate 29 and the epitaxial layer 30 may be simply and collectively called semiconductor layer, though these are described as separate structures in this preferred embodiment.

The gate trench 31 is formed in the element principal surface 47 of the epitaxial layer 30. As shown in FIG. 5, the gate trench 31 integrally includes a contact portion 49 and a gate portion 50. The gate portion 50 is arranged to serve as a MISFET-structured gate. The contact portion 49 is arranged to receive a current supplied externally to the gate portion 50.

The contact portion 49 is arranged in the outer peripheral portion 26. The contact portion 49 is formed in an elongated linear shape along the longitudinal direction (direction of extension) of the gate finger 17.

The gate portion 50 extends from the contact portion 49 across the region 27 between the element portion 25 and the outer peripheral portion 26 to the element portion 25. More specifically, the gate portion 50 is formed in a stripe form of multiple gate portions in a direction orthogonal to the longitudinal direction of the contact portion 49. The multiple gate portions 50 are in communication with each other in the contact portion 49. It is noted that the longitudinal direction of the gate portions 50 is the direction of extension of the gate portions 50 and orthogonal to the longitudinal direction of the contact portion 49.

While FIGS. 4 and 5 show only a portion of the region below the source electrode film 7, the multiple gate portions 50 may be arranged in the entire region below the source electrode film 7 on the outside of the drawings. Also, the contact portion 49 may be formed below the branch portions 18 of the gate electrode film 8, and the multiple gate portions 50 may extend from the contact portion 49 toward both the first portion 10 and the second portion 11 of the source electrode film 7, though these are not shown.

Further, as shown in FIG. 5, the width of the contact portion 49 in a plan view (the trench width in the direction orthogonal to the longitudinal direction of the contact portion 49) may be greater than the width of each gate portion 50 in a plan view (the trench width in a direction orthogonal to the longitudinal direction of each gate portion 50). For example, the contact portion 49 may have a width within a range of 0.5 μm to 2.0 μm, while each gate portion 50 may have a width within a range of 0.2 μm to 1.0 μm.

Also, as shown in FIG. 6, the distance between adjacent ones of the gate portions 50 (the pitch $P_1$ of the gate trench 31) may be, for example, within a range of 1.0 μm to 3.0 μm.

Furthermore, the contact portion 49 and the gate portions 50 have the same depth $D_1$ as each other, which may be, for example, within a range of 0.5 μm to 2.0 μm with respect to the element principal surface 47 of the epitaxial layer 30. Also, as shown in FIG. 6, each gate portion 50 may have a tapered shape in a cross-sectional view in which the width thereof decreases with an increase in the depth from the element principal surface 47 of the epitaxial layer 30. Similarly, as shown in FIG. 7, the contact portion 49 may also have a tapered shape in a cross-sectional view in which the width thereof decreases with an increase in the depth from the element principal surface 47 of the epitaxial layer 30. It is noted that if the gate portions 50 and the contact portion 49 each have a tapered shape, the widths of the gate portions 50 and the contact portion 49 may be defined as those at the element principal surface 47 of the epitaxial layer 30.

The gate insulating film 32 is formed on the inner surface of the gate trench 31. More specifically, it is formed on the entire bottom surfaces of the contact portion 49 and the gate portions 50 and partially on the side surfaces extending from the bottom surfaces toward the element principal surface 47 of the epitaxial layer 30 (to a middle portion in the depth direction of the contact portion 49 and the gate portions 50). Accordingly, the side surfaces of the contact portion 49 and the gate portions 50 are selectively exposed in the vicinity of the element principal surface 47 of the epitaxial layer 30.

The gate insulating film 32 is composed of silicon oxide (SiO$_2$) in this preferred embodiment, but may be composed of another insulating material such as, for example, silicon nitride (SiN). The gate insulating film 32 also has a thickness within a range of, for example, 30 nm to 70 nm.

The gate electrode 33 is embedded in the gate trench 31 with the gate insulating film 32 therebetween. That is, the space within the gate trench 31 surrounded by the gate insulating film 32 is filled with the gate electrode 33. In this preferred embodiment, the gate electrode 33 has a top surface 51 at a position in the depth direction of the gate trench 31 lowered with respect to the element principal surface 47 of the epitaxial layer 30.

The top surface 51 of the gate electrode 33 may have an end portion at the same depth position as an upper end 52 of the gate insulating film 32 that is positioned at the middle in the depth direction of the gate trench 31. On the other hand, as shown in FIG. 6, the top surface 51 of the gate electrode 33 may have a recessed arc shape recessed at the center thereof in the width direction of each gate portion 50. In this preferred embodiment, the gate electrode 33 is also composed of impurity-added polysilicon.

As shown in FIG. 6, the channel region 34 is formed in a region between adjacent ones of multiple gate trenches 31 (gate portions 50). More specifically, it is formed from the element principal surface 47 of the epitaxial layer 30 to a middle portion in the depth direction of each gate trench 31. This causes the channel region 34 to be opposed to the gate electrode 33 with the gate insulating film 32 therebetween. As shown in FIGS. 5 and 7, the channel region 34 is also formed around the contact portion 49 of the gate trench 31 in the outer peripheral portion 26.

The channel region 34 may have a depth within a range of, for example, 0.3 μm to 0.7 μm with respect to the element principal surface 47 of the epitaxial layer 30. The channel region 34 is of a p type in this preferred embodiment. The channel region 34 has an impurity concentration within a range of, for example, $1 \times 10^{16}$ cm$^{-3}$ to $1 \times 10^{18}$ cm$^{-3}$.

As shown in FIGS. 5 and 6, the source region 35 is formed in a region between adjacent ones of multiple gate trenches 31 (gate portions 50) and in the element principal surface 47 of the epitaxial layer 30. More specifically, it is formed in a surficial portion of the channel region 34. This causes the source region 35 to be exposed at the element principal surface 47 of the epitaxial layer 30. On the other hand, an end portion of the channel region 34 closer to the element principal surface 47 of the epitaxial layer 30 is covered with the source region 35. Also, as shown in FIG. 5, the source region 35 may not be formed in a region between adjacent ones of multiple gate trenches 31 in a portion of the element portion 25. In this portion, the channel region 34 may be exposed at the element principal surface 47 of the epitaxial layer 30.

The source region 35 is laid in the side surface of the gate trench 31 (gate portion 50) across the gate electrode 33 and the non-electrode portion (in this preferred embodiment, the interlayer insulating film 40) embedded in the gate trench 31 over the gate electrode 33. This causes a portion of the source region 35 to be opposed to the gate electrode 33 with the gate insulating film 32 therebetween and the remaining portion to be opposed to the non-electrode portion. Also, in this preferred embodiment, the depth of the source region 35 decreases from the side surfaces of a pair of gate trenches 31 on either side of the source region 35 toward the center of the region between the pair of gate trenches 31.

The source region 35 may also have a depth (e.g. a maximum depth) within a range of, for example, 0.1 μm to 0.3 μm with respect to the element principal surface 47 of the epitaxial layer 30. The source region 35 is of an n type in this preferred embodiment. The source region 35 has an impurity concentration within a range of, for example, $1 \times 10^{19}$ cm$^{-3}$ to $1 \times 10^{21}$ cm$^{-3}$.

As above, the element principal surface 47 of the epitaxial layer 30 is formed with a MISFET (Metal Insulator Semiconductor Field Effect Transistor) structure in which the p type channel region 34 is laid between the n type source region 35 and the n type epitaxial layer 30 and opposed to the gate electrode 33 with the gate insulating film 32 therebetween.

The field trench 37 extends from the element principal surface 47 of the epitaxial layer 30 through the source region 35 to the channel region 34 in a region between adjacent ones of multiple gate trenches 31 (gate portions 50). As shown in FIG. 5, the field trench 37 extends from the element portion 25 across the region 27 between the element portion 25 and the outer peripheral portion 26 to the outer peripheral portion 26. More specifically, the field trench 37 is formed in a stripe form of multiple field trenches in parallel with the gate portion 50 of the gate trench 31. In this preferred embodiment, the gate portion 50 of the gate trench 31 and the field trench 37 are formed alternately.

Also, as shown in FIG. 6, the distance between adjacent ones of the field trenches 37 (the pitch $P_2$ of the field trenches 37) may be, for example, within a range of 1.5 μm to 3.0 μm.

As shown in FIG. 6, each field trench 37 includes a first portion 53 that has a first width and a second portion 54 that has a second width smaller than the first width in the element portion 25. More specifically, the first portion 53 is formed toward the bonding surface 48 from the element principal surface 47 of the epitaxial layer 30. The second portion 54 extends from the bottom of the first portion 53 toward the bonding surface 48. The first portion 53 and the second portion 54 of the field trench 37 are linked through a stepped portion 55 inclined downward in the depth direction of the field trench 37. Thus, in a partial region of the element portion 25, the stepped portion 55 may serve as a boundary to provide a step between the upper side and the lower side in the depth direction in the side surface of the field trench 37.

It is noted that the side surface of the field trench 37 may not be provided with a step in the other region of the element portion 25, the region 27, and the outer peripheral portion 26. That is, as shown in FIG. 7, the side surface of the field trench 37 may be formed with a step in the region in which the source contact 41 is embedded, while the side surface of the field trench 37 may not be formed with a step in the region in which the interlayer insulating film 40 is embedded.

For example, the first portion 53 of the field trench 37 may have a width within a range of 0.1 μm to 0.3 μm, while the second portion 54 may have a width within a range of 0.3 μm to 0.6 μm in a plan view.

Also, the field trench 37 has the same depth $D_2$ as the gate trench 31, which may be, for example, within a range of 0.8 μm to 2.0 μm with respect to the element principal surface 47 of the epitaxial layer 30. Also, as shown in FIG. 6, the first portion 53 and the second portion 54 of the field trench 37 may each have a tapered shape in a cross-sectional view in which the width thereof decreases with an increase in the depth from the element principal surface 47 of the epitaxial layer 30. It is noted that if the first portion 53 and the second portion 54 of the field trench 37 are tapered, the widths of the first portion 53 and the second portion 54 may be defined, respectively, as the widths at the upper end portions thereof.

The channel contact region 36 is formed in a manner exposed at the side surface of the field trench 37. More specifically, it is laid in the side surface of the field trench 37 across the boundary between the first portion 53 and the second portion 54 (in this preferred embodiment, the stepped portion 55). An upper portion of the channel contact region 36 is in contact with the source region 35. The channel contact region 36 is of a p type in this preferred embodiment. The channel contact region 36 has an impurity concentration within a range of, for example, $1\times10^{19}$ cm$^{-3}$ to $1\times10^{21}$ cm$^{-3}$.

The field trench insulating film 38 is formed on the inner surface of the field trench 37. More specifically, it is formed on the entire bottom surface of the second portion 54 of the field trench 37 and partially on the side surface of the second portion 54 extending from the bottom surface toward the element principal surface 47 of the epitaxial layer 30 (to a middle portion in the depth direction of the second portion 54). This causes the first portion 53 and the stepped portion 55 of the field trench 37 to be entirely exposed, while the side surface of the second portion 54 to be selectively exposed in the vicinity of the stepped portion 55.

The field trench insulating film 38 is composed of silicon oxide (SiO$_2$) in this preferred embodiment, but may be composed of another insulating material such as, for example, silicon nitride (SiN). The field trench insulating film 38 also has a thickness within a range of, for example, 30 nm to 70 nm.

The field plat 39 is embedded in the field trench 37 with the field trench insulating film 38 therebetween. That is, the space within the field trench 37 surrounded by the field trench insulating film 38 is filled with the field plate 39. In this preferred embodiment, the field plate 39 has a first top surface 56 at a position in the depth direction of the second portion 54 of the field trench 37 lowered with respect to the stepped portion 55. In this preferred embodiment, the first top surface 56 of the field plate 39 is at a position higher than that of the lower end of the channel contact region 36. This causes a portion of the channel contact region 36 to be opposed to the field plate 39 with the field trench insulating film 38 therebetween.

The first top surface 56 of the field plate 39 may have an end portion at the same depth position as an upper end 57 of the field trench insulating film 38 that is positioned at the middle in the depth direction of the second portion 54 of the field trench 37. On the other hand, as shown in FIG. 7, the field plate 39 may have a second top surface 58 at a position higher than that of the first top surface 56 in a region in which the field trench 37 is not formed in two steps of the first portion 53 and the second portion 54. In this preferred embodiment, the field plate 39 is also composed of impurity-added polysilicon.

The interlayer insulating film 40 is formed on the entire element principal surface 47 of the epitaxial layer 30. The interlayer insulating film 40 is composed of silicon oxide (SiO$_2$) in this preferred embodiment, but may be composed of another insulating material (e.g. silicon nitride (SiN)). The interlayer insulating film 40 also has a thickness within a range of, for example, 0.1 μm to 1.5 μm.

The interlayer insulating film 40 is formed with a gate contact hole 59 and a source contact hole 60.

As shown in FIGS. 5 and 7, the gate contact hole 59 is formed from the surface of the interlayer insulating film 40 toward the contact portion 49 of the gate trench 31. In this preferred embodiment, the gate contact hole 59 is formed in an elongated linear shape along the longitudinal direction of the contact portion 49 of the gate trench 31. The gate contact hole 59 penetrates through the interlayer insulating film 40 in the thickness direction into a middle portion in the depth direction of the gate electrode 33 within the contact portion 49. The gate contact hole 59 also has a width smaller than that of the contact portion 49 of the gate trench 31.

The gate contact 42 is arranged in the gate contact hole 59 and connected to the gate electrode 33. Also, the gate contact 42 is composed of tungsten (W) in this preferred embodiment, but may be composed of another conducting material (e.g. copper (Cu)).

As shown in FIGS. 5 and 7, the source contact hole 60 is formed from the surface of the interlayer insulating film 40 toward the field trench 37. In this preferred embodiment, the source contact hole 60 is formed in an elongated linear shape along the longitudinal direction of the field trench 37 in a region in which the field trench 37 is formed in two steps of the first portion 53 and the second portion 54. The source contact hole 60 penetrates through the interlayer insulating film 40 in the thickness direction to be in communication with the first portion 53 of the field trench 37. The source contact hole 60 also has a width greater than that of the first portion 53 of the field trench 37.

The source contact 41 is arranged in the source contact hole 60 and arranged in an upper part of the field plate 39 of the field trench 37. The source contact 41 is connected to the source region 35, the channel contact region 36, and the field plate 39 within the field trench 37. In this preferred embodiment, the field plate 39 has a first top surface 56 and a second top surface 58 at their respective different heights. Thus, as shown in FIG. 7, the source contact 41 is embedded selectively in a portion of the field plate 39 in a cross-sectional view taken along the longitudinal direction of the field trench 37.

Also, the source contact 41 is composed of tungsten (W) in this preferred embodiment, but may be composed of another conducting material (e.g. copper (Cu)).

The source electrode film 7 and the gate electrode film 8 are formed on the interlayer insulating film 40. The source electrode film 7 is connected to the source contact 41. As such, the source electrode film 7 is electrically connected to the source region 35, the channel contact region 36, and the field plate 39 through the source contact 41. On the other hand, the gate electrode film 8 (gate finger 17) is connected to the gate contact 42. As such, the gate electrode film 8 is electrically connected to the gate electrode 33 through the gate contact 42.

As shown in FIGS. 6 and 7, the element portion impurity region 43 is formed below a region between adjacent ones of multiple gate trenches 31 in the element portion 25. In this preferred embodiment, it is formed around the field trench 37. The element portion impurity region 43 is of a p type in this preferred embodiment. The element portion impurity region 43 has an impurity concentration within a range of, for example, $1\times10^{15}$ cm$^{-3}$ to $1\times10^{18}$ cm$^{-3}$.

The element portion impurity region 43 includes a first portion 61 and a second portion 62. The first portion 61 of the element portion impurity region 43 is formed below the field trench 37 in a separated manner and, as shown in FIG. 7, extends along the longitudinal direction of the field trench 37. For example, the first portion 61 of the element portion impurity region 43 has a depth $D_3$ within a range of 1.4 μm to 4.0 μm with respect to the element principal surface 47 of the epitaxial layer 30.

The second portion 62 of the element portion impurity region 43 is connected integrally to the channel region 34 and protrudes selectively from the channel region 34 toward the bonding surface 48 of the epitaxial layer 30. As shown in FIG. 7, the second portion 62 of the element portion impurity region 43 also extends along the longitudinal direction of the field trench 37. For example, the second portion 62 of the element portion impurity region 43 has a depth $D_4$ within a range of 1.0 μm to 3.0 μm with respect to the element principal surface 47 of the epitaxial layer 30.

As mentioned above, a portion of the channel region 34 is formed around the contact portion 49 of the gate trench 31 in the outer peripheral portion 26. Accordingly, the second portion 62 of the element portion impurity region 43 also protrudes from the channel region 34 of the outer peripheral portion 26 and may be formed at the bottom of the contact portion 49 of the gate trench 31.

Also, the first portion 61 and the second portion 62 of the element portion impurity region 43 are separated from each other. As such, an n type portion 63 of the epitaxial layer 30 is interposed between the first portion 61 and the second portion 62 of the element portion impurity region 43.

The element portion impurity region 43 may further include a third portion 64 formed below the contact portion 49 of the gate trench 31. The third portion 64 of the element portion impurity region 43 is connected integrally to the second portion 62 at the bottom of the contact portion 49 of the gate trench 31 and protrudes selectively from the second portion 62 toward the bonding surface 48 of the epitaxial layer 30. Also, the third portion 64 of the element portion impurity region 43 is separated from the first portion 61 of the element portion impurity region 43. The third portion 64 of the element portion impurity region 43 also has the same depth as the first portion 61 of the element portion impurity region 43.

The drain electrode 44 is formed on the secondary surface 46 of the semiconductor substrate 29. The drain electrode 44 is bonded to the entire secondary surface 46 of the semiconductor substrate 29. The drain electrode 44 is composed of AlCu (an alloy of aluminum and copper) in this preferred embodiment, but may be composed of another conducting material (e.g. aluminum).

<Structure of the Outer Peripheral Portion 26>

As shown in FIGS. 8 to 10, the semiconductor device 1 includes, in the outer peripheral portion 26, multiple guard ring trenches 23, an insulating film 65 as an example of the first insulating film of the present invention, an embedded conductive material 66 as an example of the conductive material of the present invention, and an outer peripheral portion impurity region 67.

The multiple guard ring trenches 23 are formed in the element principal surface 47 of the epitaxial layer 30. In this preferred embodiment, the multiple guard ring trenches 23 include a first unit 68, a second unit 69, a third unit 70, and a fourth unit 71 from the inner side toward the outer side of the outer peripheral portion 26, for example. The first unit 68, the second unit 69, the third unit 70, and the fourth unit 71 each have a collection of multiple guard ring trenches 23. In this preferred embodiment, the first unit 68 includes four guard ring trenches 23, the second unit 69 includes seven guard ring trenches 23, the third unit 70 includes four guard ring trenches 23, and the fourth unit 71 includes three guard ring trenches 23.

The distance between adjacent ones of the guard ring trenches 23 (the pitch of the guard ring trenches 23) may be different for each of the first unit 68, the second unit 69, the third unit 70, and the fourth unit 71. In this preferred embodiment, the pitch $P_3$ of the guard ring trenches 23 in the first unit 68 is greater than the pitch $P_4$ of the guard ring trenches 23 in the second unit 69. For example, the pitch $P_3$ of the guard ring trenches 23 in the first unit 68 may be within a range of 1.0 μm to 3.0 μm and the pitch $P_4$ of the guard ring trenches 23 in the second unit 69 may be within a range of 0.5 μm to 2.5 μm.

The pitch $P_5$, $P_6$ of the guard ring trenches 23 in the third unit 70 and the fourth unit 71 may also be smaller than the pitch $P_3$ of the guard ring trenches 23 in the first unit 68. In this preferred embodiment, the pitch $P_5$, $P_6$ of the guard ring trenches 23 in the third unit 70 and the fourth unit 71 is equal to the pitch $P_4$ of the guard ring trenches 23 in the second unit 69.

On the other hand, the depth $D_5$ of the multiple guard ring trenches 23 may be the same for all of the first unit 68, the second unit 69, the third unit 70, and the fourth unit 71. The depth $D_5$ of the multiple guard ring trenches 23 may also be the same as the depth $D_1$ of the gate trench 31. That is, the multiple guard ring trenches 23 may have a depth within a range of 0.8 μm to 2.0 μm with respect to the element principal surface 47 of the epitaxial layer 30.

The insulating film 65 is formed on the inner surface of each guard ring trench 23. More specifically, it is formed on the entire bottom surfaces of the guard ring trenches 23 and partially on the side surfaces extending from the bottom surfaces toward the element principal surface 47 of the epitaxial layer 30 (to a middle portion in the depth direction of each guard ring trench 23). Accordingly, the side surfaces of the guard ring trenches 23 are selectively exposed in the vicinity of the element principal surface 47 of the epitaxial layer 30.

The insulating film 65 is composed of silicon oxide ($SiO_2$) in this preferred embodiment, but may be composed of another insulating material such as, for example, silicon nitride (SiN). The insulating film 65 also has a thickness within a range of, for example, 30 nm to 70 nm.

The embedded conductive material 66 is embedded in each guard ring trench 23 with the insulating film 65 therebetween. That is, the space within each guard ring trench 23 surrounded by the insulating film 65 is filled with the embedded conductive material 66. In this preferred embodiment, the embedded conductive material 66 has a top surface 72 at a position in the depth direction of the guard ring trenches 23 lowered with respect to the element principal surface 47 of the epitaxial layer 30.

The top surface 72 of the embedded conductive material 66 may have an end portion at the same depth position as an upper end 73 of the insulating film 65 that is positioned at the middle in the depth direction of the guard ring trenches 23. In this preferred embodiment, the embedded conductive material 66 is also composed of impurity-added polysilicon.

The outer peripheral portion impurity region 67 is of a p type in this preferred embodiment. The outer peripheral portion impurity region 67 has an impurity concentration within a range of, for example, $1 \times 10^{15}$ $cm^{-3}$ to $1 \times 10^{18}$ $cm^{-3}$.

In this preferred embodiment, the outer peripheral portion impurity region 67 includes a base portion 74, a first portion 75, a second portion 76, a third portion 77, and a fourth portion 78.

The base portion 74 of the outer peripheral portion impurity region 67 is an impurity region extending further outward from the channel region 34 that advances from the element portion 25 to around the contact portion 49 of the gate trench 31 in the outer peripheral portion 26. More specifically, the base portion 74 of the outer peripheral portion impurity region 67 is formed continuously between the first unit 68 and the second unit 69 of multiple guard ring trenches 23 and arranged in a region between adjacent ones of multiple guard ring trenches 23 and at the bottom of the multiple guard ring trenches 23 to be exposed to the element principal surface 47 of the epitaxial layer 30. That is, base portions 74 of the outer peripheral portion impurity region 67 around the first unit 68 and the second unit 69 are linked to each other at the bottom of each guard ring trench 23. Also, the base portion 74 has a depth $D_6$ within a range of, for example, 0.8 μm to 2.5 μm with respect to the element principal surface 47 of the epitaxial layer 30.

As shown in FIG. 9, the first portion 75 of the outer peripheral portion impurity region 67 is arranged below the multiple guard ring trenches 23 that belong to the first unit 68. More specifically, the first portion 75 of the outer peripheral portion impurity region 67 is connected integrally to the base portion 74 below the multiple guard ring trenches and protrudes selectively from the base portion 74 of the outer peripheral portion impurity region 67 toward the bonding surface 48 of the epitaxial layer 30. The first portion 75 of the outer peripheral portion impurity region 67 is formed in a closed annular shape extending along the longitudinal direction of the guard ring trenches 23. Also, the first portion 75 has a depth $D_7$ (an example of the first depth of the present invention) within a range of, for example, 1.4 μm to 4.0 μm with respect to the element principal surface 47 of the epitaxial layer 30.

As shown in FIG. 9, the second portion 76 of the outer peripheral portion impurity region 67 is arranged below the multiple guard ring trenches 23 that belong to the second unit 69. More specifically, the second portion 76 of the outer peripheral portion impurity region 67 is connected integrally to the base portion 74 below the multiple guard ring trenches and protrudes selectively from the base portion 74 of the outer peripheral portion impurity region 67 toward the bonding surface 48 of the epitaxial layer 30. The second portion 76 of the outer peripheral portion impurity region 67 is formed in a closed annular shape extending along the longitudinal direction of the guard ring trenches 23. Also, the second portion 76 has a depth $D_8$ (an example of the second depth of the present invention) within a range of, for example, 1.2 μm to 3.5 μm, which is smaller than the depth $D_7$ of the first portion 75, with respect to the element principal surface 47 of the epitaxial layer 30.

As shown in FIG. 10, the third portion 77 of the outer peripheral portion impurity region 67 is arranged in a region between adjacent ones of multiple guard ring trenches 23 in the third unit 70 and has a depth to a middle portion in the depth direction of the guard ring trenches 23 with respect to the element principal surface 47 of the epitaxial layer 30. Accordingly, to the side surfaces of the guard ring trenches 23 in the third unit 70, the third portion 77 of the p type outer peripheral portion impurity region 67 is exposed at the upper side, while an n type portion 79 of the epitaxial layer 30 is exposed at the lower side. The bottoms of the multiple guard ring trenches 23 in the third unit 70 are also formed by the n type portion 79 of the epitaxial layer 30. Also, the third portion 77 of the outer peripheral portion impurity region 67 has a depth $D_9$ within a range of, for example, 0.3 μm to 0.7 μm, which is smaller than the depths $D_7$, $D_8$ of the first portion 75 and the second portion 76, with respect to the element principal surface 47 of the epitaxial layer 30.

On the other hand, a region between adjacent ones of guard ring trenches 23 in the fourth unit 71 is formed by an n type portion 80 of the epitaxial layer 30 entirely in the depth direction of the guard ring trenches 23. That is, the region between adjacent ones of guard ring trenches 23 in the fourth unit 71 may not be formed with the outer peripheral portion impurity region 67.

Thus, in this preferred embodiment, outer peripheral portion impurity regions 67 in the first unit 68, the second unit 69, and the third unit 70 that are arranged in this order outward in the outer peripheral portion 26 are formed to be shallower sequentially outward. Accordingly, as shown in FIGS. 9 and 10, the outer peripheral portion impurity region 67 is formed in a stepwise manner in a cross-sectional view outward in the outer peripheral portion 26.

The fourth portion 78 of the outer peripheral portion impurity region 67 is formed on the outer side of the epitaxial layer 30 relative to the outermost one of the multiple guard ring trenches 23. The fourth portion 78 of the outer peripheral portion impurity region 67 is separated from the third portion 77 of the outer peripheral portion impurity region 67 and from the end face of the semiconductor device 1 in a direction along the element principal surface 47 of the epitaxial layer 30. As shown in FIG. 8, the fourth portion 78 of the outer peripheral portion impurity region 67 is formed in a closed annular shape extending along the longitudinal direction of the guard ring trenches 23.

The fourth portion 78 of the outer peripheral portion impurity region 67 has a depth $D_{10}$ greater than that of the guard ring trenches 23 with respect to the element principal surface 47 of the epitaxial layer 30. In this preferred embodiment, the depth $D_{10}$ of the fourth portion 78 of the outer peripheral portion impurity region 67 is greater than that of the base portion 74, while smaller than that of the second portion 76. For example, the fourth portion 78 may have a depth within a range of, for example, 1.0 μm to 3.0 μm with respect to the element principal surface 47 of the epitaxial layer 30.

The element principal surface 47 of the epitaxial layer 30 is further formed with a conducting ring 81. As is the case with the guard ring trenches 23, the conducting ring 81 is formed in a closed annular shape extending along the first end face 2, the second end face 3, the third end face 4, and the fourth end face 5 of the semiconductor device 1. As shown in FIGS. 8 and 10, the conducting ring 81 is arranged in a manner covering the outermost one of the multiple guard ring trenches 23 and at least one of the remaining inner guard ring trenches 23. In this preferred embodiment, the conducting ring 81 is arranged in a manner covering the multiple guard ring trenches 23 in the fourth unit 71.

In this preferred embodiment, the conducting ring 81 is formed integrally with the embedded conductive material 66 that is embedded in the guard ring trenches 23. That is, the conducting ring 81 may be composed of impurity-added polysilicon. The conducting ring 81 also has a lead-out portion 82 led out to the outer side relative to the outermost one of the multiple guard ring trenches 23. The lead-out portion 82 is laid across the boundary between the fourth portion 78 of the outer peripheral portion impurity region 67 and the n type portion 80 of the epitaxial layer 30. This causes the lead-out portion 82 to be opposed to the fourth portion 78 of the outer peripheral portion impurity region 67 and the n type portion 80 of the epitaxial layer 30 with the insulating film 65 therebetween.

The interlayer insulating film 40 is formed on the element principal surface 47 of the epitaxial layer 30 and covers the conducting ring 81 in the outer peripheral portion 26. The interlayer insulating film 40 is formed with a first contact hole 83 and a second contact hole 84.

As shown in FIGS. 8 and 10, the first contact hole 83 is formed from the surface of the interlayer insulating film 40 toward the conducting ring 81. In this preferred embodiment, the first contact hole 83 is formed in a closed annular shape extending along the longitudinal direction of the conducting ring 81. The first contact hole 83 penetrates through the interlayer insulating film 40 in the thickness direction into a middle portion in the thickness direction of the conducting ring 81.

A first contact 85 is arranged in the first contact hole 83. The first contact 85 is connected to the conducting ring 81.

Also, the first contact 85 is composed of tungsten (W) in this preferred embodiment, but may be composed of another conducting material (e.g. copper (Cu)).

As shown in FIGS. 8 and 10, the second contact hole 84 is formed from the surface of the interlayer insulating film 40 toward the fourth portion 78 of the outer peripheral portion impurity region 67. In this preferred embodiment, the second contact hole 84 is formed in a closed annular shape extending along the longitudinal direction of the fourth portion 78 of the outer peripheral portion impurity region 67. The second contact hole 84 penetrates through the interlayer insulating film 40 in the thickness direction into a middle portion in the depth direction of the fourth portion 78.

A second contact 86 is arranged in the second contact hole 84. The second contact 86 is connected to the conducting ring 81. Also, the second contact 86 is composed of tungsten (W) in this preferred embodiment, but may be composed of another conducting material (e.g. copper (Cu)).

As mentioned above, the outer peripheral electrode film 9 is formed in a manner separated outward from the gate electrode film 8. Thus, as shown in FIGS. 8 to 10, there is an annular region 87 with no electrode film therein between the gate electrode film 8 and the outer peripheral electrode film 9.

In this preferred embodiment, the gate electrode film 8 covers the multiple guard ring trenches 23 in the first unit 68 and some of the multiple guard ring trenches 23 in the second unit 69. On the other hand, the outer peripheral electrode film 9 covers the multiple guard ring trenches 23 in the fourth unit 71 and the fourth portion 78 of the outer peripheral portion impurity region 67. Accordingly, the others of the multiple guard ring trenches 23 in the second unit 69 and the multiple guard ring trenches 23 in the third unit 70 of the outer peripheral portion impurity region 67 are opposed to the region 87 with the interlayer insulating film 40 therebetween.

The outer peripheral electrode film 9 is connected to the conducting ring 81 through the first contact 85 and connected to the fourth portion 78 of the outer peripheral portion impurity region 67 through the second contact 86. As such, the fourth portion 78 of the outer peripheral portion impurity region 67 is electrically connected to the embedded conductive material 66 that is embedded in the outermost one of the multiple guard ring trenches 23.

Next will be described a method of manufacturing the semiconductor device 1. FIGS. 11 to 25 are views showing sequential steps of a process of manufacturing the semiconductor device 1. FIGS. 11 to 25 are drawings that correspond to FIG. 9. No manufacturing process views will be shown corresponding to the other cross-sectional views, FIGS. 6, 7, and 10.

Figure 11:
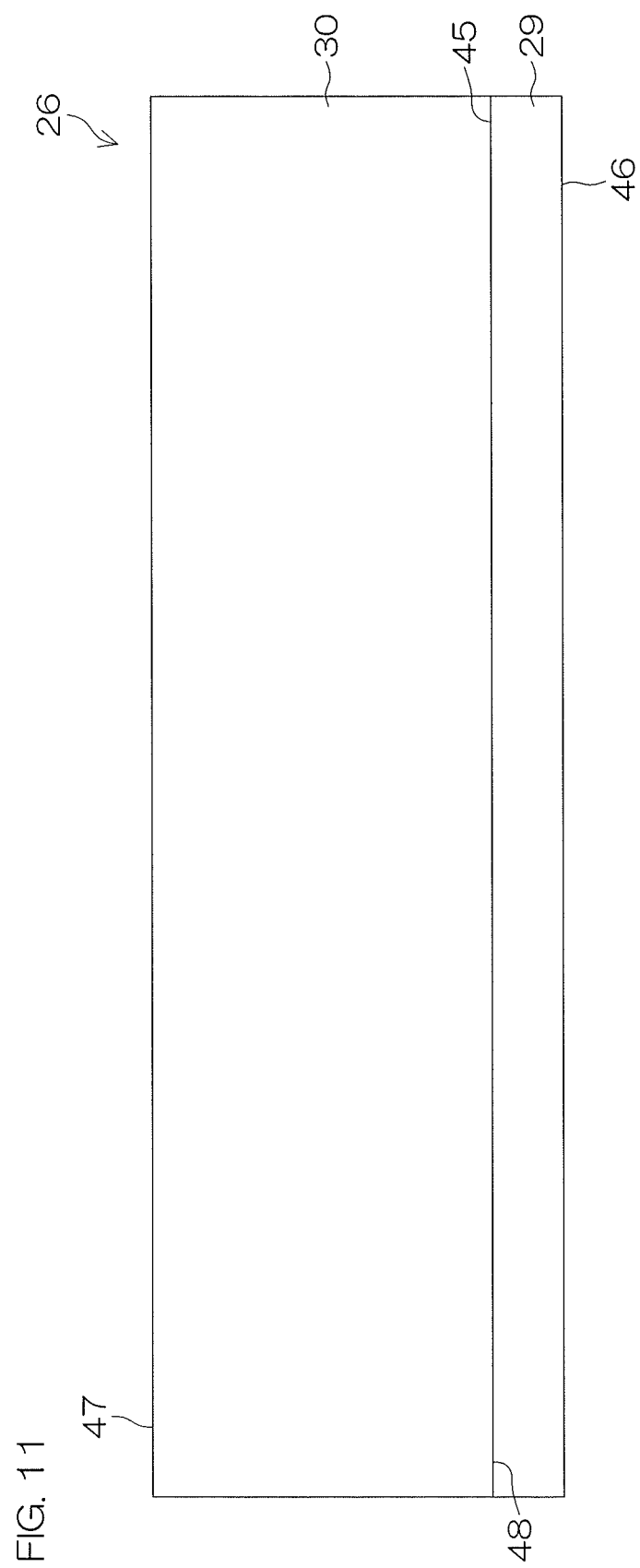
FIGS. 11 to 25 are views showing sequential steps of a process of manufacturing the semiconductor device.

First, as shown in FIG. 11, an epitaxial method is used to form an n type impurity-implanted epitaxial layer 30 on the principal surface 45 of the semiconductor substrate 29. For example, P (phosphor), As (arsenic), Sb (antimony), or the like can be applied as the n type impurity (the same applies to the following).

Figure 12:
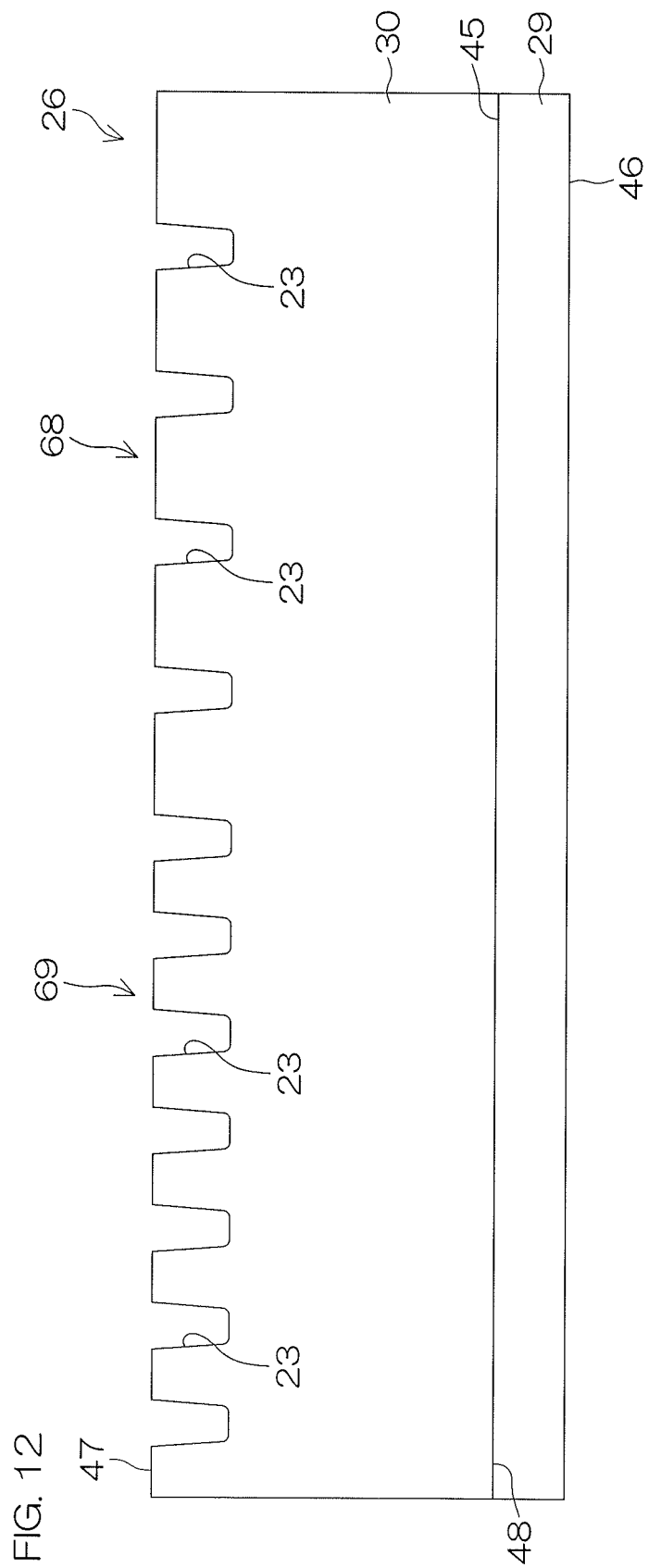

Next, as shown in FIG. 12, the element principal surface 47 of the epitaxial layer 30 is selectively removed to form a gate trench 31 and a field trench 37. The gate trench 31 and the field trench 37 may be formed by, for example, dry etching.

Figure 13:
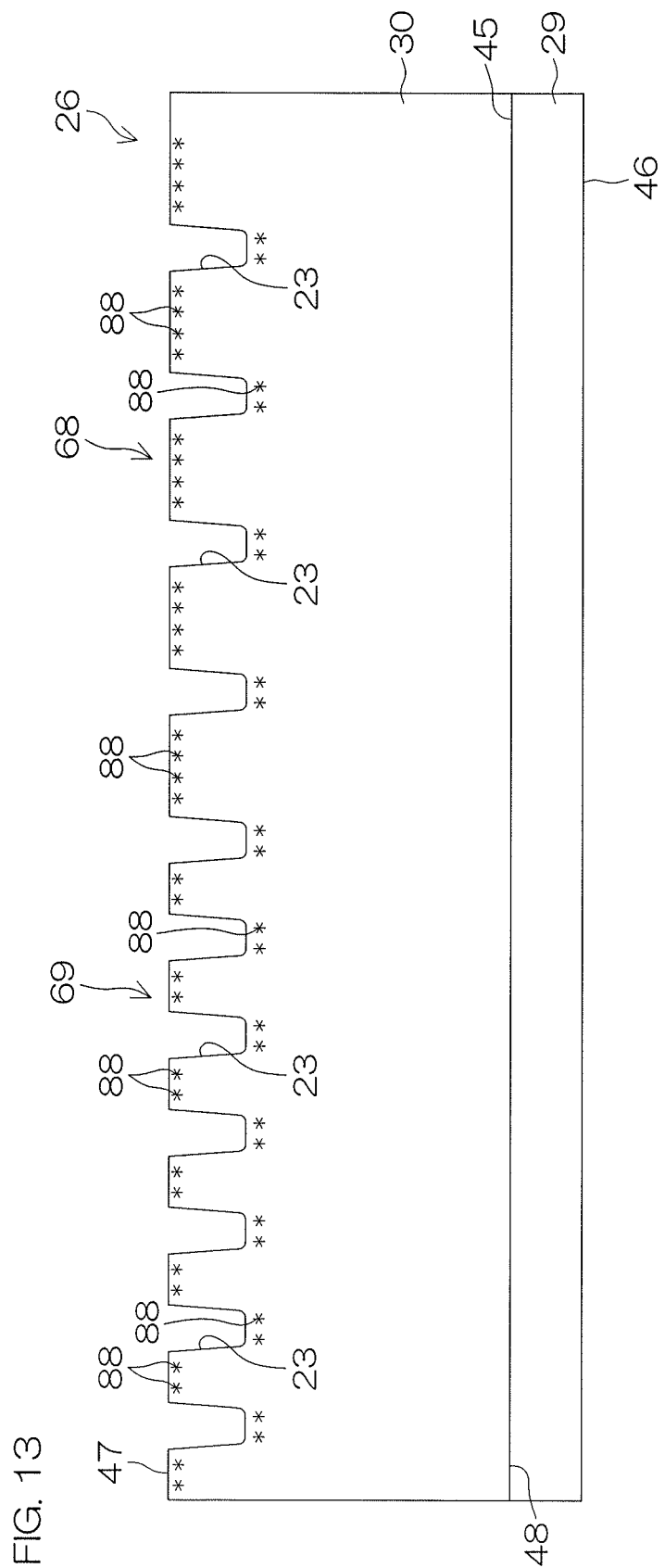

Next, as shown in FIG. 13, p type impurities are implanted selectively into the principal surface 45 of the semiconductor substrate 29 at a first energy (e.g. an energy of about 30 keV). More specifically, p type impurities are implanted into regions in which the channel region 34, the first portion 61, the second portion 62, and the third portion 64 of the element portion impurity region 43, and the base portion 74, the first portion 75, the second portion 76, the third portion 77, and the fourth portion 78 of the outer peripheral portion impurity region 67 should be formed. For example, B (boron), Al (aluminum), Ga (gallium), or the like can be applied as the p type impurity.

It is noted that in FIG. 13 and the following figures, implantation sites 88 into which impurities are implanted at the first energy are indicated by "*".

Figure 14:
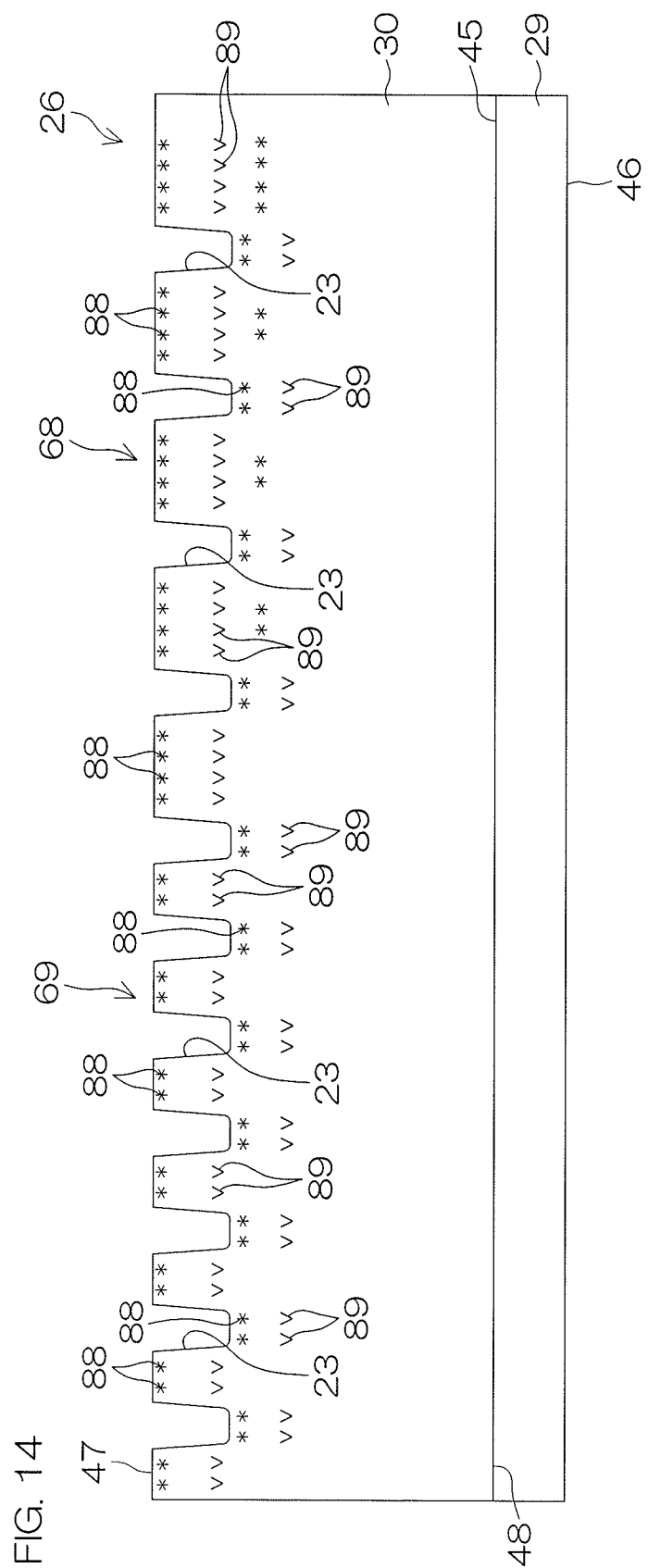

Next, as shown in FIG. 14, p type impurities are implanted selectively into the principal surface 45 of the semiconductor substrate 29 at a second energy (e.g. an energy of about 180 keV), which is higher than the first energy. More specifically, p type impurities are implanted into regions in which the second portion 62 and the third portion 64 of the element portion impurity region 43, and the base portion 74, the first portion 75, the second portion 76, and the fourth portion 78 of the outer peripheral portion impurity region 67 should be formed. It is noted that in FIG. 14 and the following figures, implantation sites 89 into which impurities are implanted at the second energy are indicated by "v".

Figure 15:
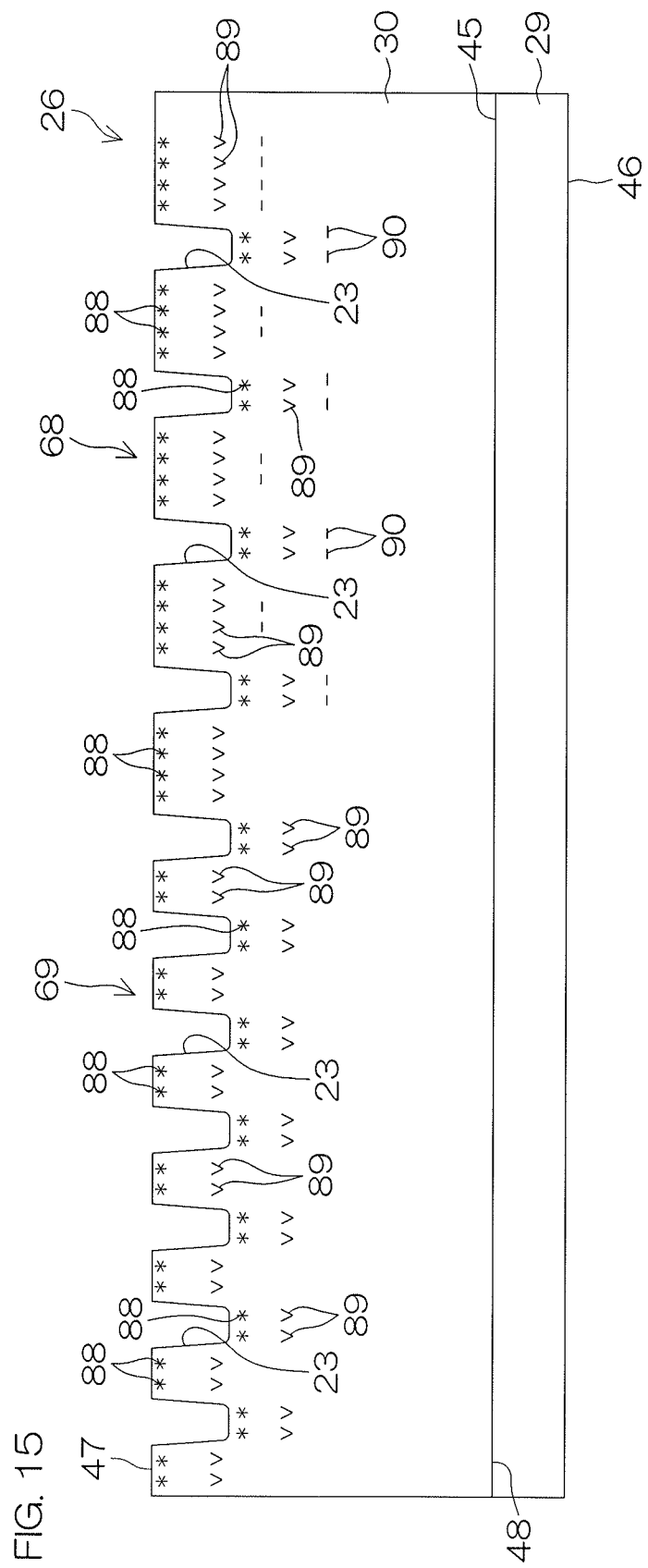

Next, as shown in FIG. 15, p type impurities are implanted selectively into the principal surface 45 of the semiconductor substrate 29 at a third energy (e.g. an energy of about 360 keV), which is higher than the second energy. More specifically, p type impurities are implanted into regions in which the first portion 61 and the third portion 64 of the element portion impurity region 43, and the first portion 75 and the fourth portion 78 of the outer peripheral portion impurity region 67 should be formed. It is noted that in FIG. 15, implantation sites 90 into which impurities are implanted at the third energy are indicated by "-".

Figure 16:
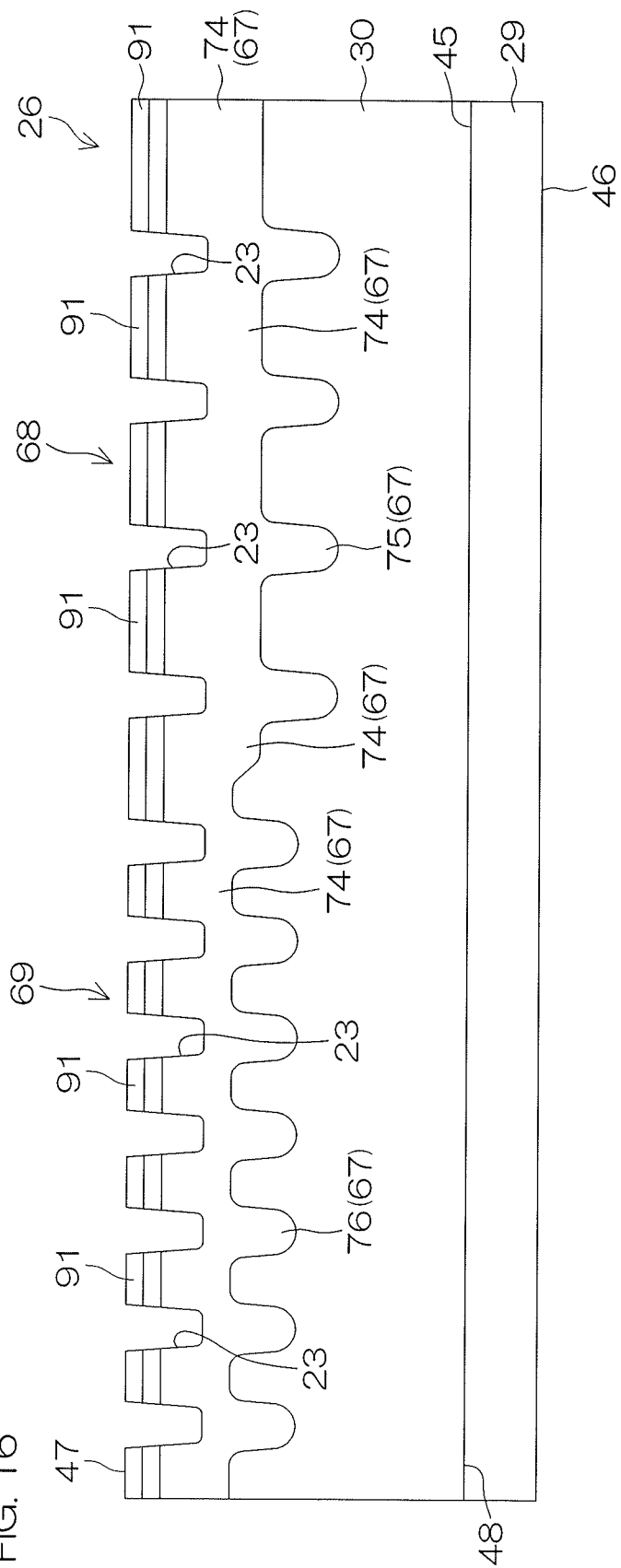

Next, as shown in FIG. 16, the epitaxial layer 30 is thermally treated to cause diffusion of impurity ions implanted in the steps of FIGS. 13 to 15. This causes an element portion impurity region 43 and an outer peripheral portion impurity region 67 to be formed. Also, the diffusion of impurities implanted in the implantation sites 88 causes a p type portion 91 to be formed on the element principal surface 47 of the epitaxial layer 30.

Figure 17:
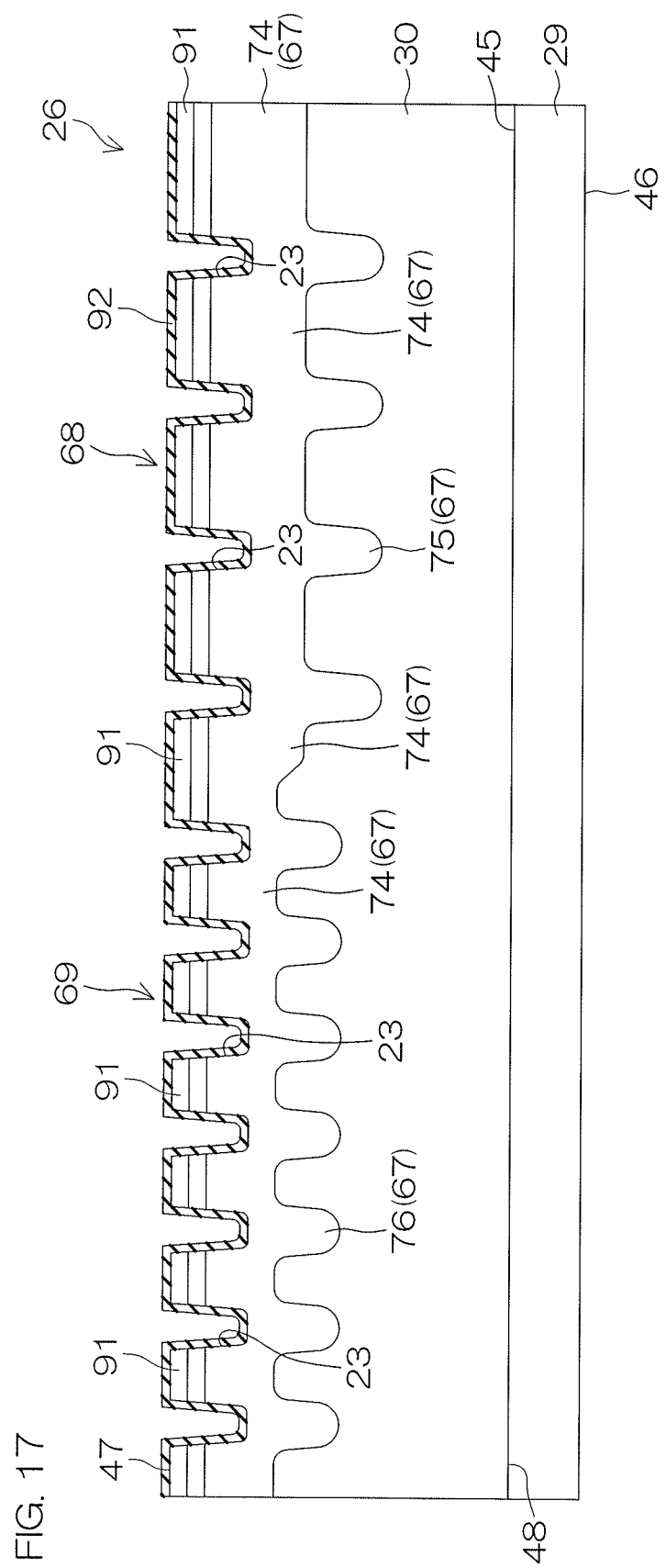

Next, as shown in FIG. 17, the epitaxial layer 30 is thermally oxidized to cause an insulating film 92 to be formed on the entire element principal surface 47 of the epitaxial layer 30. The insulating film 92 is also formed on the inner surfaces of the gate trench 31 and the field trench 37.

Figure 18:
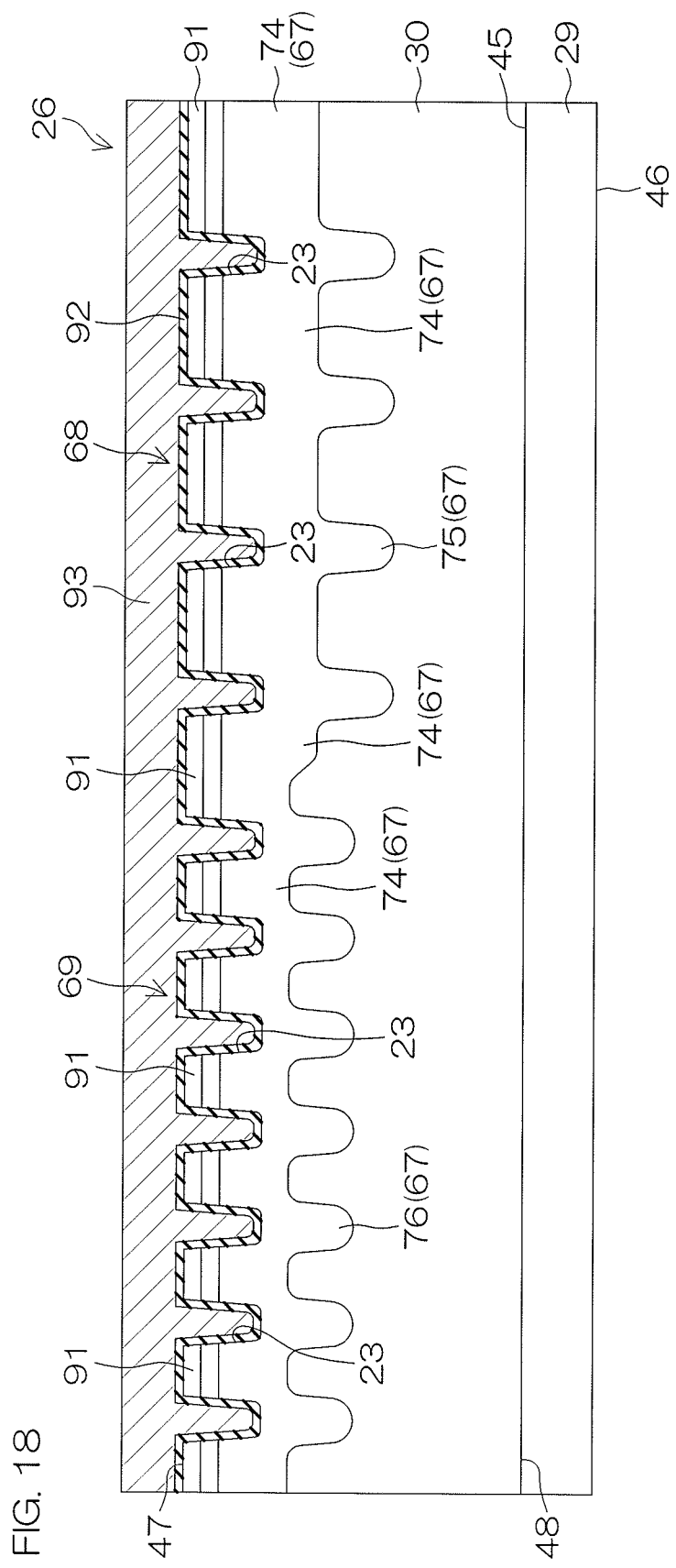

Next, as shown in FIG. 18, a CVD method, for example, is used to deposit a conducting material 93 in a manner covering the entire insulating film 92. In this preferred embodiment, the conducting material 93 may be, for example, impurity-added polysilicon.

Figure 19:
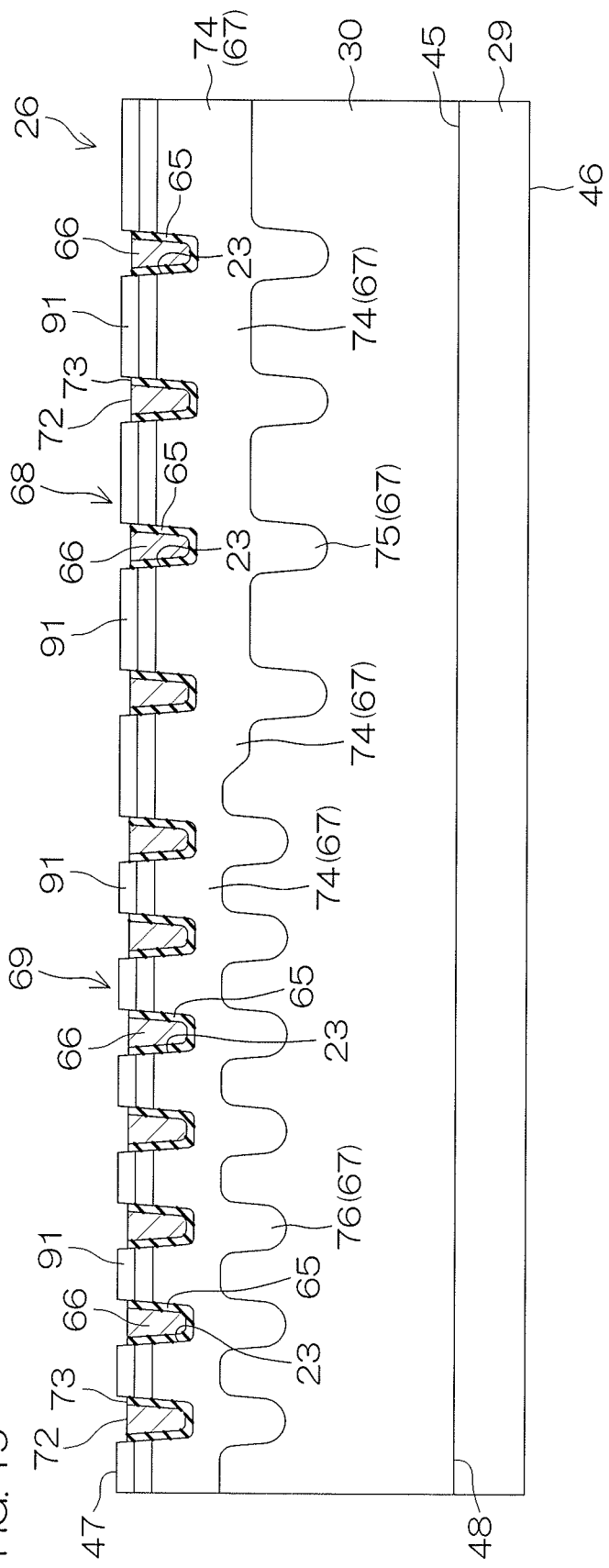

Next, as shown in FIG. 19, the deposited conducting material 93 and the insulating film 92 are partially etched back, for example, to be selectively removed. Thus, the remaining portion of the conducting material 93 results in a gate electrode 33, a field plate 39, an embedded conductive material 66, and a conducting ring 81, while the remaining portion of the insulating film 92 results in a gate insulating film 32, a field trench insulating film 38, and an insulating film 65.

Figure 20:
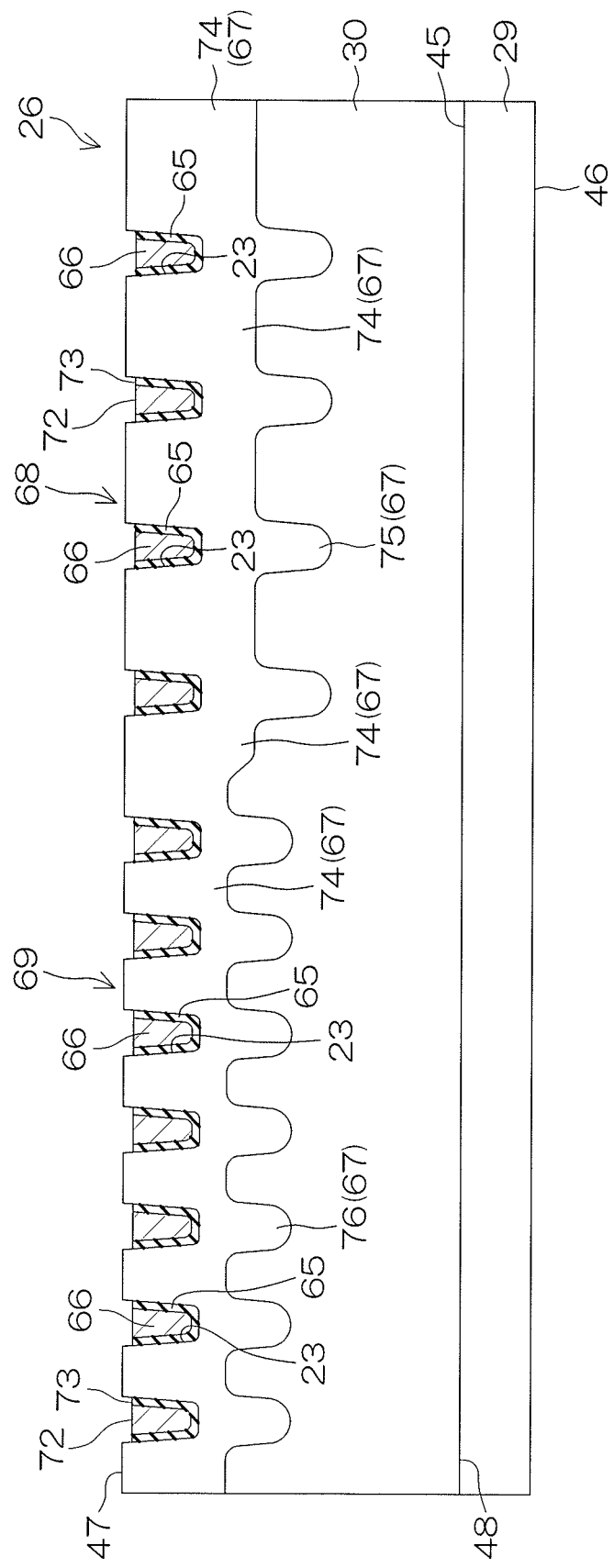

Next, as shown in FIG. 20, p type impurities are implanted selectively into the principal surface 45 of the semiconductor substrate 29 at a fourth energy (e.g. an energy of about 80 keV), which is between the first energy and the second energy. More specifically, p type impurities are implanted into regions in which the channel region 34, the element portion impurity region 43, and the outer peripheral portion impurity region 67 should be formed. Thereafter, the epitaxial layer 30 is thermally treated to cause diffusion of impurity ions implanted in this step. The channel region 34 is thus formed. In the element portion 25, the p type portion 91 and the second portion 62 of the element portion impurity region 43 are integrated with the channel region 34. Also, in the outer peripheral portion 26, the p type portion 91 is integrated with the base portion 74 of the outer peripheral portion impurity region 67. Further, in the outer peripheral portion 26, the p type portion 91 is integrated with the fourth portion 78 of the outer peripheral portion impurity region 67.

Figure 21:
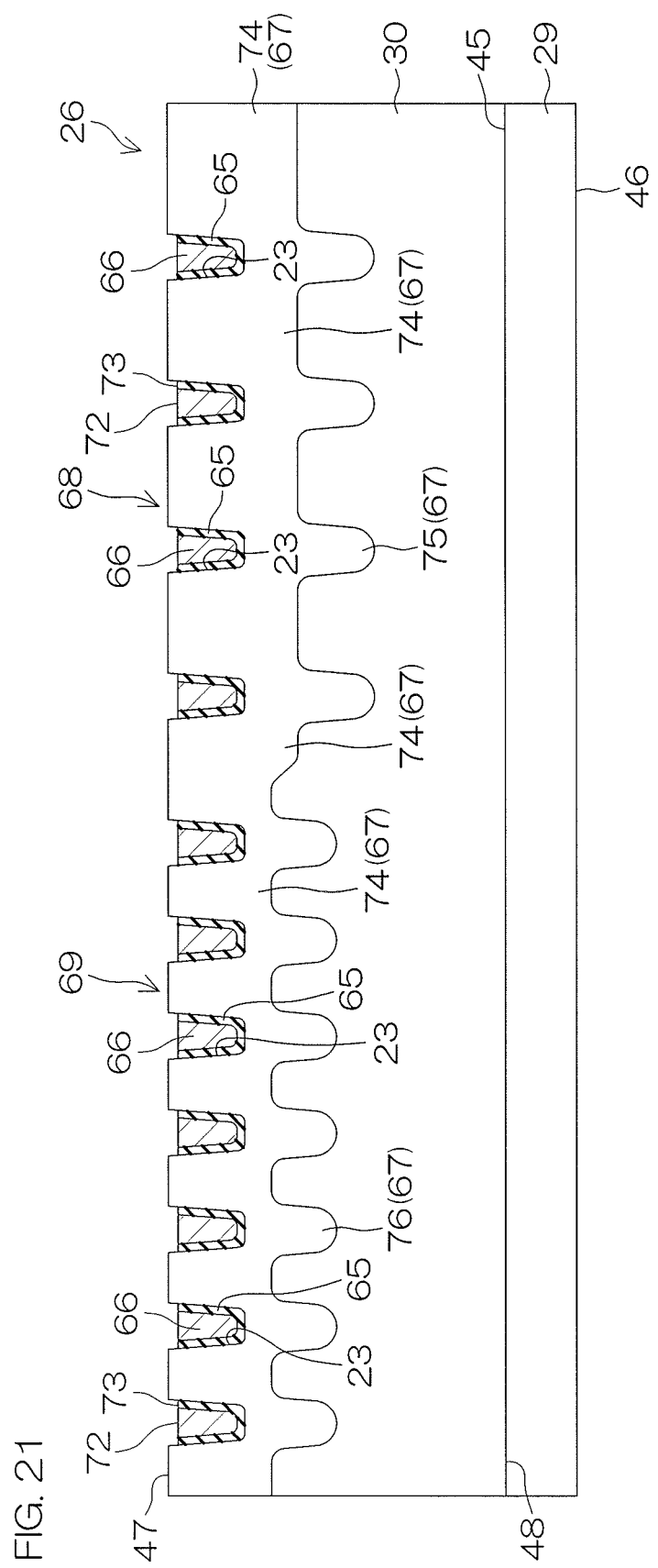

Next, n type impurities are implanted selectively into the principal surface 45 of the semiconductor substrate 29, though this is not shown in FIG. 21. More specifically, n type impurities are implanted into regions in which the source region 35 should be formed. Thereafter, the epitaxial layer 30 is thermally treated to cause diffusion of impurity ions implanted in this step. The source region 35 is thus formed.

Figure 22:
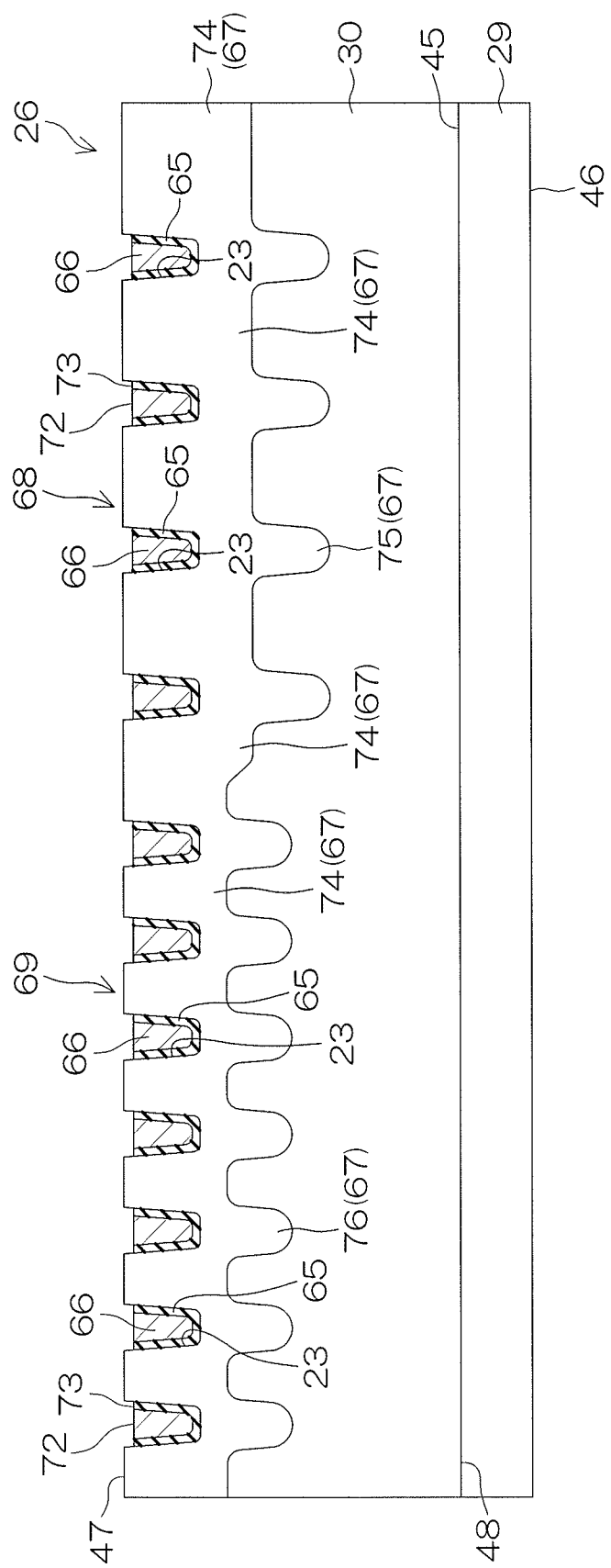

Next, p type impurities are implanted selectively into the principal surface 45 of the semiconductor substrate 29, though this is not shown in FIG. 22. More specifically, p type impurities are implanted into regions in which the channel contact region 36 should be formed. Thereafter, the epitaxial layer 30 is thermally treated to cause diffusion of impurity ions implanted in this step. The channel contact region 36 is thus formed.

Figure 23:
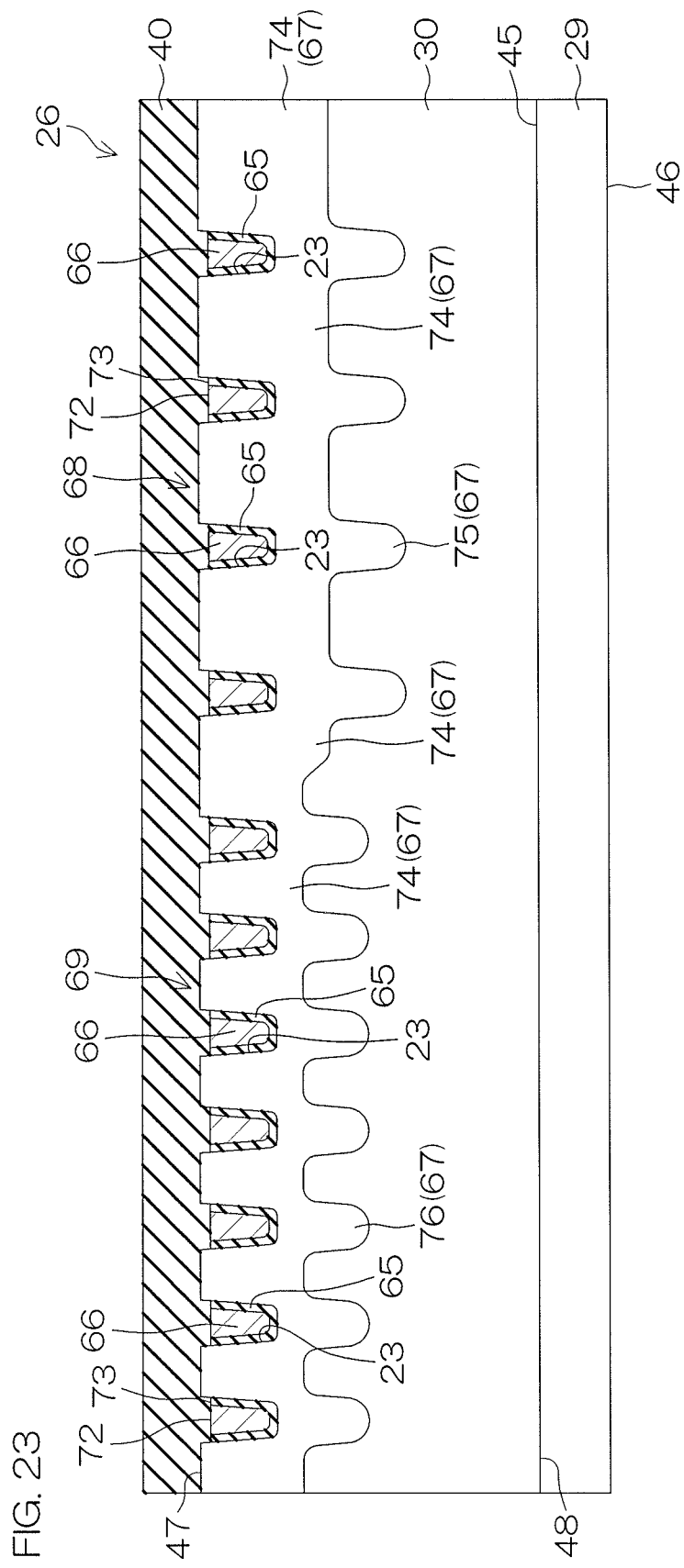

Next, as shown in FIG. 23, a CVD method, for example, is used to form an interlayer insulating film 40 in a manner covering the entire element principal surface 47 of the epitaxial layer 30. Next, the interlayer insulating film 40 is selectively etched to form a gate contact hole 59, a source contact hole 60, a first contact hole 83, and a second contact hole 84. It is noted that the gate contact hole 59, the source contact hole 60, the first contact hole 83, and the second contact hole 84 are formed in the same step in this preferred embodiment, but may be formed, respectively, through separate etching steps.

The contact holes 59, 60, 83, 84 are also formed in a manner of being over-etched below the element principal surface 47 of the epitaxial layer 30. During the over-etching, a stepped portion 55 and a second portion 62 are therefore formed in the field trench 37.

Figure 24:
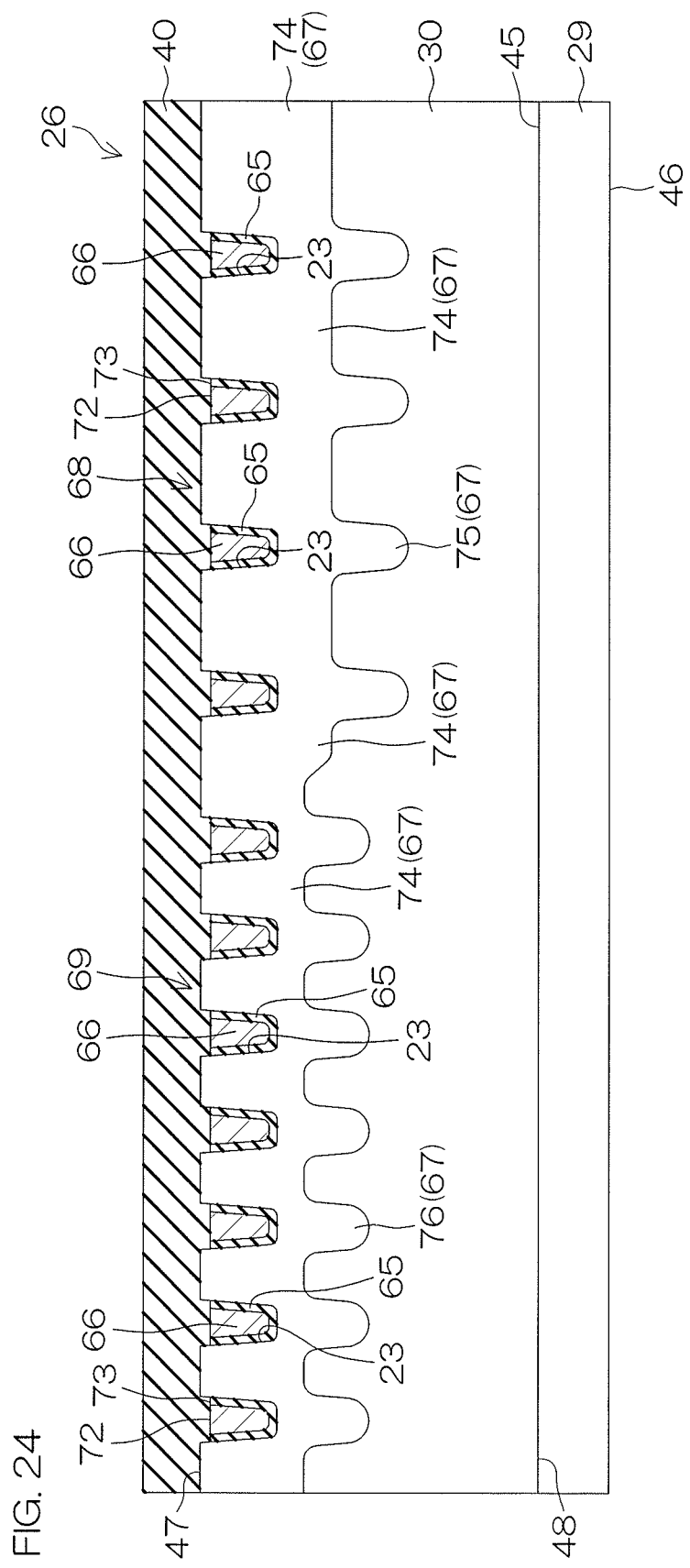

Next, a sputtering method, for example, is used to deposit a conducting material on the interlayer insulating film 40 for a source contact 41, a gate contact 42, a first contact 85, and a second contact 86, though this is not shown in FIG. 24. Thereafter, a CMP method, for example, is used to remove the conducting material on the surface of the interlayer insulating film 40. Thus, the conducting material remaining in the source contact hole 60, the gate contact hole 59, the first contact hole 83, and the second contact hole 84 results in a source contact 41, a gate contact 42, a first contact 85, and a second contact 86.

Figure 25:
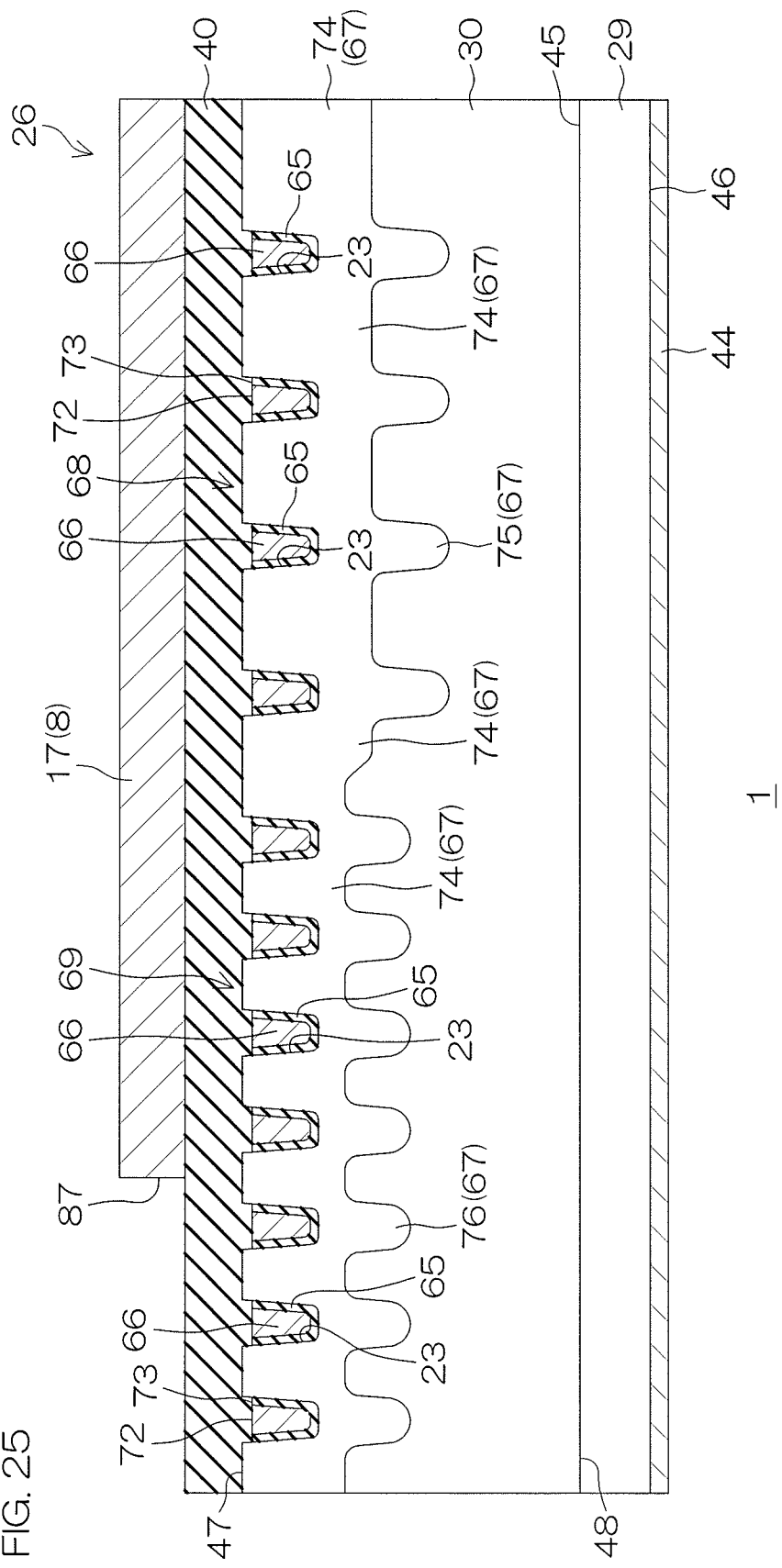

Next, as shown in FIG. 25, a sputtering method, for example, is used to deposit a conducting material on the interlayer insulating film 40 for a surface electrode film 6. Thereafter, the conducting material is selectively removed to result in a source electrode film 7, a gate electrode film 8, and an outer peripheral electrode film 9. A drain electrode 44 is then formed on the secondary surface 46 of the semiconductor substrate 29 to achieve a semiconductor device 1.

As described heretofore, in accordance with the semiconductor device 1 according to this preferred embodiment, outer peripheral portion impurity regions 67 in the first unit 68 and the second unit 69 that are arranged in this order outward in the outer peripheral portion 26 are formed to be shallower sequentially outward. Accordingly, as shown in FIG. 9, the outer peripheral portion impurity regions 67 are formed in a stepwise manner in a cross-sectional view outward in the outer peripheral portion 26. This causes a depletion layer to be likely to extend outward in the outer peripheral portion 26, whereby electric field concentration in the outer peripheral portion can be reduced.

For example, the electric field distribution in the structure shown in FIG. 9, in which the first portion 75 and the second portion 76 of the outer peripheral portion impurity region 67 are included, and the electric field distribution in a structure without the second portion 76 of the foregoing structure were simulated and compared. As a result, it was recognized that the electric field concentration intensity of the structure with both the first portion 75 and the second portion 76 of the outer peripheral portion impurity region 67 can be reduced to approximately 85% of the electric field concentration intensity of the structure without the second portion 76.

While the preferred embodiments of the present invention have heretofore been described, the present invention can also be embodied in other modes.

Figure 26:
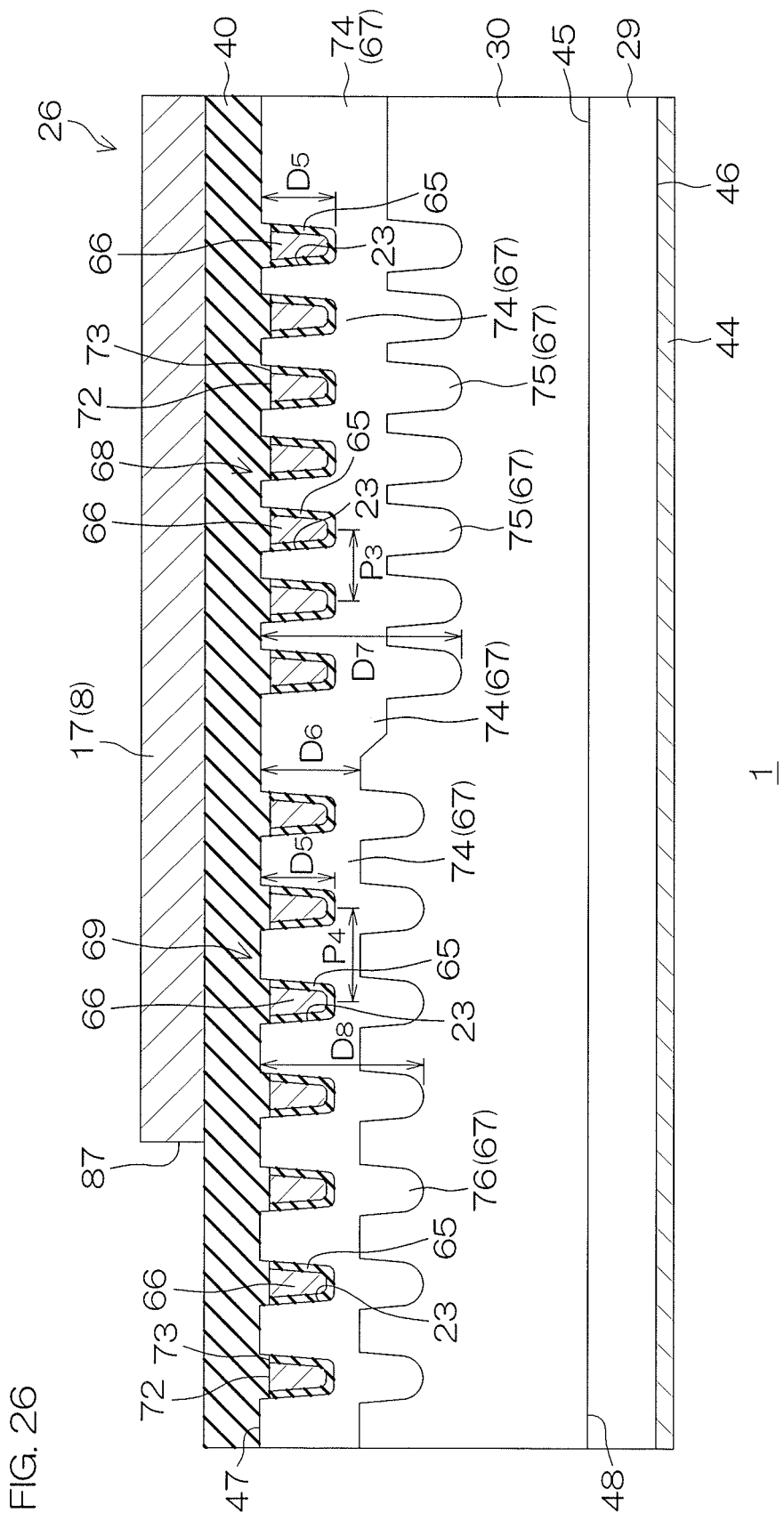
FIG. 26 is a cross-sectional view of a semiconductor device according to a preferred embodiment of the present invention.

For example, in the above-mentioned preferred embodiment, the pitch $P_3$ of the guard ring trenches 23 in the first unit 68 is greater than the pitch $P_4$ of the guard ring trenches 23 in the second unit 69. In contrast, the pitch $P_3$ of the guard ring trenches 23 in the first unit 68 may be smaller than the pitch $P_4$ of the guard ring trenches 23 in the second unit 69, as shown in FIG. 26. In accordance with this arrangement, equipotential lines are less likely to enter between adjacent guard ring trenches 23 in the vicinity of the contact portion 49 of the gate trench 31, around which electric field concentration is likely to occur. This allows a depletion layer to be more likely to extend outward in the outer peripheral portion 26.

Figure 27:
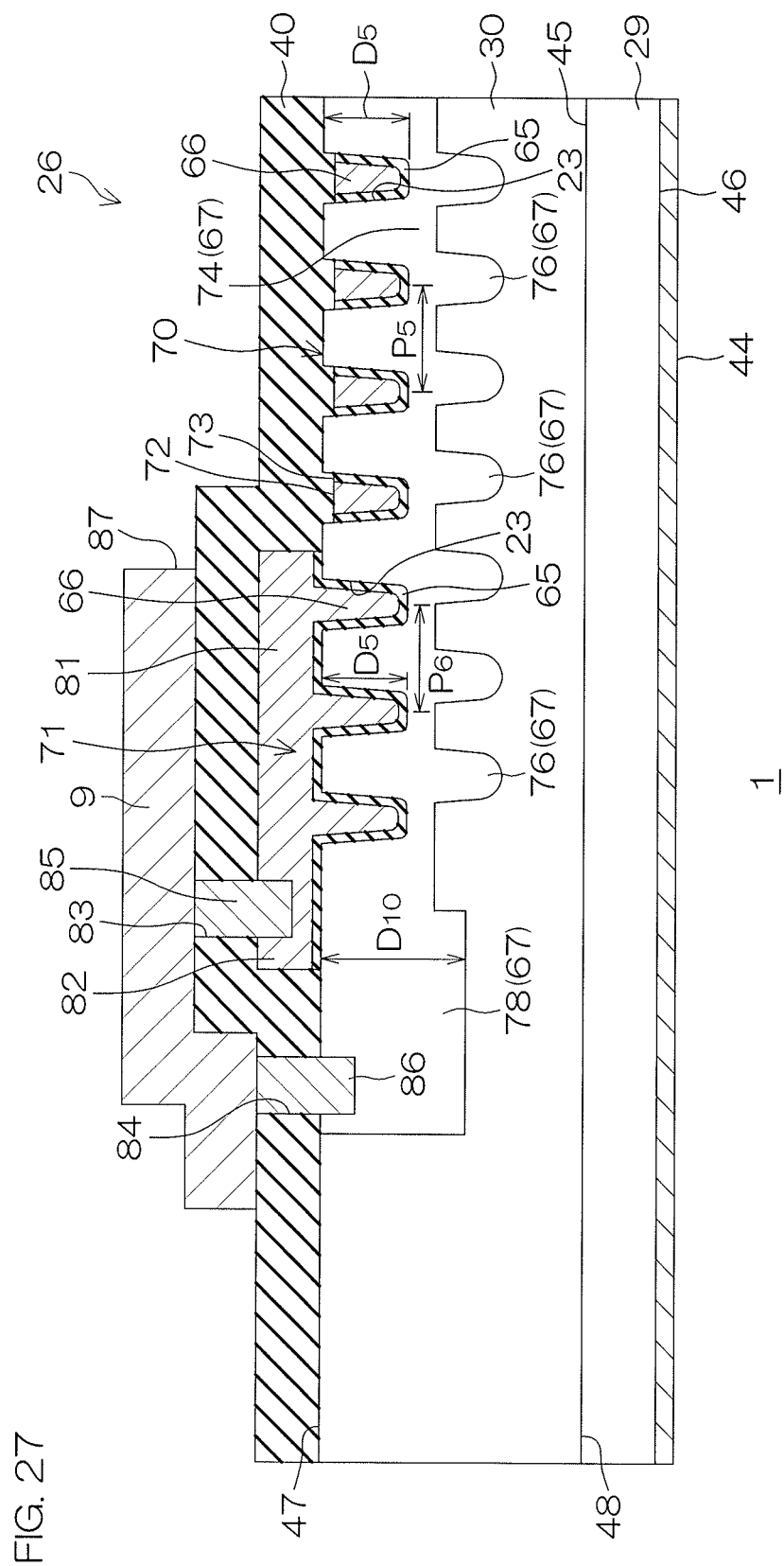
FIG. 27 is a cross-sectional view of a semiconductor device according to a preferred embodiment of the present invention.

Also, in the above-mentioned preferred embodiment, a region between adjacent ones of guard ring trenches 23 in the third unit 70 and the fourth unit 71 is partially or entirely formed by an n type portion 79, 80 of the epitaxial layer 30. In contrast, the base portion 74 and the second portion 76 of the outer peripheral portion impurity region 67 may be formed also in the third unit 70 and the fourth unit 71 continuously from the second unit 69, as shown in FIG. 27. In this case, the base portion 74 may be linked with the fourth portion 78.

For example, an arrangement may also be employed in which the conductivity type of each semiconductor portion in the semiconductor devices 1 is inverted. For example, in the semiconductor devices 1, the p type portions may be of an n type, while the n type portions may be of a p type.

Also, the semiconductor element structure included in the semiconductor device 1 is not limited to such a MISFET structure as mentioned above, but may be another element structure such as, for example, an IGBT or a Schottky barrier diode.

Various other design changes may be made within the scope of the matters as set forth in the appended claims.

The invention claimed is:
1. A semiconductor device, comprising:
a first conductivity type semiconductor layer having a first surface and a second surface opposite to the first surface and having an element portion formed in the first surface and an outer peripheral portion surrounding the element portion;

a semiconductor element structure formed in the element portion;

a plurality of guard ring recessed portions formed in the outer peripheral portion and each formed in the first surface of the semiconductor layer; and a second conductivity type outer peripheral portion impurity region formed in the outer peripheral portion, wherein the plurality of guard ring recessed portions include a first unit consisting of a plurality of guard ring recessed portions and a second unit consisting of a plurality of guard ring recessed portions arranged on the outside of the semiconductor layer relative to the plurality of guard ring recessed portions belonging to the first unit, and wherein the outer peripheral portion impurity region includes a first portion arranged below the plurality of guard ring recessed portions belonging to the first unit and having a first depth with respect to the first surface of the semiconductor layer and a second portion arranged below the plurality of guard ring recessed portions belonging to the second unit and having a second depth smaller than the first depth with respect to the first surface of the semiconductor layer.

2. The semiconductor device according to claim 1, wherein
the outer peripheral portion impurity region further includes a base portion formed continuously between the first unit and the second unit, arranged in a region between adjacent ones of the plurality of guard ring recessed portions and at the bottom of the plurality of guard ring recessed portions, and exposed to the first surface of the semiconductor layer, and wherein
the first portion and the second portion are connected integrally to the base portion below the plurality of guard ring recessed portions and each protrude selectively from the base portion toward the second surface of the semiconductor layer.

3. The semiconductor device according to claim 1, wherein
the plurality of guard ring recessed portions further include a third unit consisting of a plurality of guard ring recessed portions arranged on the outside of the semiconductor layer relative to the plurality of guard ring recessed portions belonging to the second unit, and wherein
the outer peripheral portion impurity region further includes a third portion arranged in a region between adjacent ones of the plurality of guard ring recessed portions in the third unit and having a depth to a middle portion in a depth direction of the guard ring recessed portions with respect to the first surface of the semiconductor layer.

4. The semiconductor device according to claim 3, wherein
the plurality of guard ring recessed portions further include a fourth unit consisting of a plurality of guard ring recessed portions arranged on the outside of the semiconductor layer relative to the plurality of guard ring recessed portions belonging to the third unit, and wherein
a first conductivity type portion of the semiconductor layer is arranged in a region between adjacent ones of the plurality of guard ring recessed portions in the fourth unit over the entire depth direction of the guard ring recessed portions.

5. The semiconductor device according to claim 1, wherein
a pitch of the plurality of guard ring recessed portions belonging to the first unit is greater than a pitch of the plurality of guard ring recessed portions belonging to the second unit.

6. The semiconductor device according to claim 1, wherein
a pitch of the plurality of guard ring recessed portions belonging to the first unit is smaller than a pitch of the plurality of guard ring recessed portions belonging to the second unit.

7. The semiconductor device according to claim 1, wherein
a depth of the plurality of the guard ring recessed portions is within a range of 0.8 μm to 3.0 μm,
the first depth is within a range of 0.8 μm to 3.0 μm, and
the second depth is within a range of 0.8 μm to 2.0 μm.

8. The semiconductor device according to claim 1, further comprising:
a first insulating film formed on an inner surface of the plurality of the guard ring recessed portions; and
a conductive material embedded in the guard ring recessed portions with the first insulating film therebetween.

9. The semiconductor device according to claim 8, wherein the first insulating film includes a silicon oxide film and the conductive material includes polysilicon.

10. The semiconductor device according to claim 8, wherein the outer peripheral portion impurity region further includes a fourth portion formed on the outside of the semiconductor layer relative to an outermost one of the plurality of the guard ring recessed portions and having a depth greater than that of the guard ring recessed portions with respect to the first surface of the semiconductor layer.

11. The semiconductor device according to claim 10, wherein the fourth portion of the outer peripheral portion impurity region is electrically connected to the conductive material embedded in the outermost one of the plurality of the guard ring recessed portions.

12. The semiconductor device according to claim 1, wherein the semiconductor element structure includes:
a plurality of gate recessed portions formed in the first surface of the semiconductor layer;
a gate insulating film formed on an inner surface of the plurality of gate recessed portions;
a gate electrode embedded in the gate recessed portions with the gate insulating film therebetween;
a second conductivity type channel region formed in a region between adjacent ones of the plurality of gate recessed portions; and
a first conductivity type source region being in contact with the channel region, formed in the first surface of the semiconductor layer in a region between adjacent ones of the plurality of gate recessed portions.

13. The semiconductor device according to claim 12, further comprising a second conductivity type element portion impurity region formed below a region between adjacent ones of the plurality of gate recessed portions, wherein
the element portion impurity region includes a first portion having a depth equal to the first depth with respect to the first surface of the semiconductor layer.

14. The semiconductor device according to claim 13, wherein the element portion impurity region includes a second portion connected integrally to the channel region and protruding selectively from the channel region toward the second surface of the semiconductor layer.

15. The semiconductor device according to claim 14, wherein the first portion of the element portion impurity region is separated from the second portion of the element portion impurity region in a direction from the first surface toward the second surface of the semiconductor layer.

16. The semiconductor device according to claim 12, further comprising:
   a field recessed portion extending in a region between adjacent ones of the plurality of gate recessed portions from the first surface of the semiconductor layer through the source region to the channel region; and
   an embedded contact embedded in the field recessed portion and electrically connected to the source region and the channel region.

17. The semiconductor device according to claim 16, further comprising:
   a second insulating film formed selectively on the inner surface of the field recessed portion and on an inner surface formed by the channel region; and
   a field plate composed of a conductive material embedded in the field recessed portion with the second insulating film therebetween.

18. The semiconductor device according to claim 17, wherein the field plate is electrically connected to the embedded contact.

* * * * *